(12) United States Patent
Park et al.

(10) Patent No.: US 11,910,698 B2
(45) Date of Patent: Feb. 20, 2024

(54) INFRARED ABSORPTION COMPOSITION, AND PHOTOELECTRIC DEVICE, ORGANIC SENSOR, AND ELECTRONIC DEVICE INCLUDING THE SAME

(71) Applicant: Samsung Electronics Co., Ltd., Suwon-si (KR)

(72) Inventors: Insun Park, Suwon-si (KR); Rae Sung Kim, Hwaseong-si (KR); Dong-Seok Leem, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 424 days.

(21) Appl. No.: 17/323,294

(22) Filed: May 18, 2021

(65) Prior Publication Data

US 2021/0367166 A1  Nov. 25, 2021

(30) Foreign Application Priority Data

May 19, 2020 (KR) .................. 10-2020-0060004

(51) Int. Cl.
  *H10K 85/30* (2023.01)
  *H10K 85/60* (2023.01)
  (Continued)

(52) U.S. Cl.
  CPC .......... *H10K 85/30* (2023.02); *H10K 85/215* (2023.02); *H10K 85/331* (2023.02); *H10K 85/6576* (2023.02); *H10K 30/30* (2023.02)

(58) Field of Classification Search
  CPC .... H10K 85/30; H10K 85/331; H10K 85/215; H10K 85/6576
  See application file for complete search history.

(56) References Cited

U.S. PATENT DOCUMENTS 10,297,766 B2   5/2019 Nakata et al.
2018/0315936 A1* 11/2018 Hirade .............. H10K 85/40

FOREIGN PATENT DOCUMENTS

JP    2010/232410 A    10/2010
JP    2018188617 A     11/2018
WO   WO-2019/185578 A1 10/2019

OTHER PUBLICATIONS

I.H. Campbell and B.K. Crone, 'A near infrared organic photodiode with gain at low bias voltage' *Applied Physics Letters*, vol. 95, Dec. 2009, 263302.

(Continued)

*Primary Examiner* — Dale E Page
*Assistant Examiner* — Abbigale A Boyle
(74) *Attorney, Agent, or Firm* — Harness, Dickey & Pierce, P.L.C.

(57) ABSTRACT

Disclosed are an infrared absorption composition, and a photoelectric device, an organic sensor, and an electronic device including the same. The infrared absorption composition includes a p-type semiconductor compound represented by Chemical Formula 1 and an n-type semiconductor compound. The n-type semiconductor compound includes a compound represented by Chemical Formula 2A, a compound represented by Chemical Formula 2B, a compound represented by Chemical Formula 2C, a fullerene derivative, or a combination thereof. The p-type semiconductor compound and the n-type semiconductor compound provide a bulk heterojunction (BHJ) structure.

27 Claims, 10 Drawing Sheets

(51) Int. Cl.
    *H10K 85/20*    (2023.01)
    *H10K 30/30*    (2023.01)

(56)     References Cited

OTHER PUBLICATIONS

Naoki Ohtani and Shouta Majima, 'Improved Dark Current Properties in Bi-Layer Structured Organic Photodetectors' *Advanced Materials Research*, vol. 650, 2013, pp. 54-57.
Naoki Ohtani et al., 'Organic near-infrared photodiodes containing a wide-bandgap polymer and an n-type dopant in the active layer' *Phys. Status Solidi C*, vol. 8, No. 9, May 2011, pp. 2907-2910.
Extended European Search Report dated Nov. 10, 2021, issued in corresponding European Patent Application No. 21174451.1.
European Office Action dated Oct. 12, 2023 issued in corresponding European Appln. No. 21174451.1.
N. Strobel et al. 'Color-Selective Printed Organic Photodiodes for Filterless Multichannel Visible Light Communication' Advanced Materials, 2020, 32, 1908258.

* cited by examiner

INFRARED ABSORPTION COMPOSITION, AND PHOTOELECTRIC DEVICE, ORGANIC SENSOR, AND ELECTRONIC DEVICE INCLUDING THE SAME

CROSS-REFERENCE TO RELATED APPLICATION

This application claims priority to and the benefit of Korean Patent Application No. 10-2020-0060004 filed in the Korean Intellectual Property Office on May 19, 2020, the entire contents of which are incorporated herein by reference.

BACKGROUND

1. Field

An infrared absorption composition and a photoelectric device, an organic sensor and/or an electronic device including the same are disclosed.

2. Description of Related Art

An imaging device may be used in a digital camera and a camcorder, etc., to capture an image and to store it as an electrical signal, and the imaging device may include a sensor for separating incident light according to a wavelength and converting each component to an electrical signal.

Recently, photoelectric devices in an infrared region have been researched to improve sensitivity of a sensor in low illumination environment and/or to be used as a biometric device.

SUMMARY

Some embodiments provide an infrared absorption composition having improved infrared light absorption characteristics.

Some embodiments provide an infrared absorbing/blocking film including the infrared absorption composition.

Some embodiments provide a photoelectric device including the infrared absorption composition.

Some embodiments provide a sensor including the infrared absorption composition or the photoelectric device.

Some embodiments provide an electronic device including the photoelectric device or the sensor.

According to some embodiments, an infrared absorption composition includes a p-type semiconductor compound represented by Chemical Formula 1; and an n-type semiconductor compound selected from a compound represented by Chemical Formula 2A, a compound represented by Chemical Formula 2B, a compound represented by Chemical Formula 2C, a fullerene derivative, or a combination thereof; wherein the p-type semiconductor compound and the n-type semiconductor compound provide a bulk heterojunction (BHJ) structure.

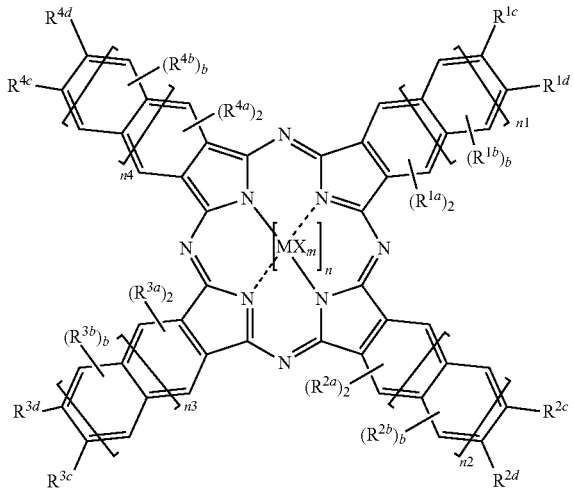

[Chemical Formula 1]

In Chemical Formula 1,
M may be Sn, Ni, V, Al, Zn, Si, Co, or Ge,
X may be a halogen,
m may be an integer from 0 to 4,
n may be 0 or 1,
two $R^{1a}$'s, two $R^{2a}$'s, two $R^{3a}$'s, and two $R^{4a}$'s each independently may be hydrogen, deuterium, a halogen, a cyano group (—CN), a C1 to C20 haloalkyl group, a C1 to C20 cyanoalkyl group, a C1 to C20 alkyl group, or a C1 to C20 alkoxy group, provided that at least one of two $R^{1a}$'s, at least one of two $R^{2a}$'s, at least one of two $R^{3a}$'s, and at least one of two $R^{4a}$'s are a C1 to C20 alkyl group or a C1 to C20 alkoxy group,
$R^{1b}$, $R^{1c}$, $R^{1d}$, $R^{2b}$, $R^{2c}$, $R^{2d}$, $R^{3b}$, $R^{3c}$, $R^{3d}$, $R^{4b}$, $R^{4c}$, and $R^{4d}$ may each independently be hydrogen, deuterium, a halogen, a C1 to C20 haloalkyl group, a cyano group (—CN), a C1 to C20 cyanoalkyl group, a C1 to C20 alkyl group, or a C1 to C20 alkoxy group,
b may be an integer of 0 to 2, and
n1, n2, n3, and n4 may each independently be an integer from 1 to 4,

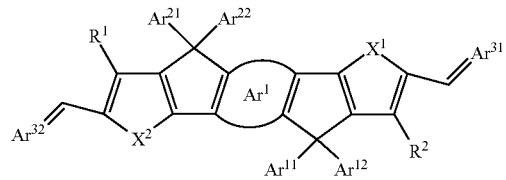

[Chemical Formula 2A]

wherein, in Chemical Formula 2A,
Ar may be one of the moieties represented by Chemical Formula 3,
$X^1$ and $X^2$ may each independently be S, Se, or Te,
$Ar^{11}$, $Ar^{12}$, $Ar^{21}$, and $Ar^{22}$ may each independently be a substituted or unsubstituted C6 to C10 aryl group or a substituted or unsubstituted C3 to C10 heteroaryl group,
$Ar^{31}$ and $Ar^{32}$ may each independently be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and R$^1$ and R$^2$ may each independently be hydrogen or a C1 to C10 alkyl group,

[Chemical Formula 3]

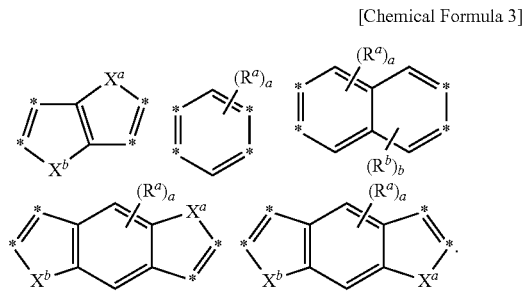

wherein, in Chemical Formula 3,
X$^a$ and X$^b$ may each independently be S, Se, or Te,
R$^a$ and R$^b$ may each independently be hydrogen or a C1 to C20 alkyl group, and
a and b may each independently be 1 or 2,

[Chemical Formula 2B]

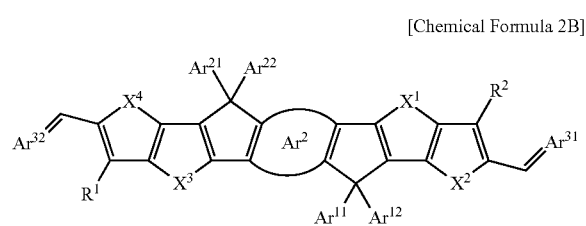

wherein, in Chemical Formula 2B,
Ar$^2$ may be one of the moieties represented by Chemical Formula 3,
X$^1$, X$^2$, X$^3$, and X$^4$ may each independently be S, Se, or Te,
Ar$^{11}$, Ar$^{12}$, Ar$^{21}$, and Ar$^{22}$ may each independently be a substituted or unsubstituted C6 to C10 aryl group or a substituted or unsubstituted C3 to C10 heteroaryl group,
Ar$^{31}$ and Ar$^{32}$ may each independently be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and
R$^1$ and R$^2$ may each independently be hydrogen or a C1 to C10 alkyl group,

[Chemical Formula 2C]

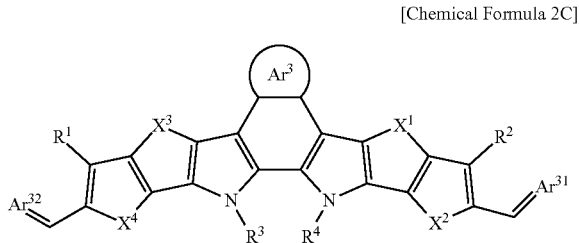

wherein, in Chemical Formula 2C
Ar$^3$ may be one of the moieties represented by Chemical Formula 4,
X$^1$, X$^2$, X$^3$, and X$^4$ may each independently be S, Se, or Te,
R$^3$ and R$^4$ may each independently be hydrogen, a C1 to C20 alkyl group, a C6 to C10 aryl group, or a C2 to C10 heteroaryl group,
Ar$^{31}$ and Ar$^{32}$ may each independently be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and
R$^1$ and R$^2$ may each independently be hydrogen or a C1 to C10 alkyl group:

[Chemical Formula 4]

wherein, in Chemical Formula 4,
Y$^1$ may be CR$^p$R$^q$, NR$^r$, O, S, Se, or Te, wherein R$^p$, R$^q$, and R$^r$ may each independently be hydrogen or a C1 to C20 alkyl group, and
Z$^1$ to Z$^4$ may each independently be CR$^s$ or N, wherein R$^s$ may be hydrogen or a C1 to C20 alkyl group.

In some embodiments, the p-type semiconductor compound represented by Chemical Formula 1 may be one of the compounds represented by Chemical Formulas 1A to 1C.

[Chemical Formula 1A]

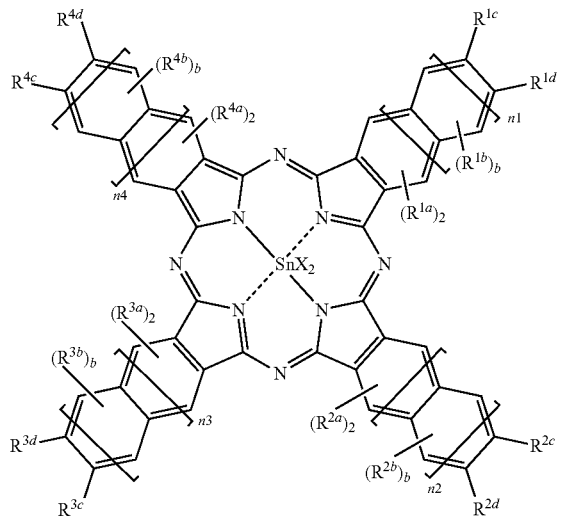

-continued

[Chemical Formula 1B]

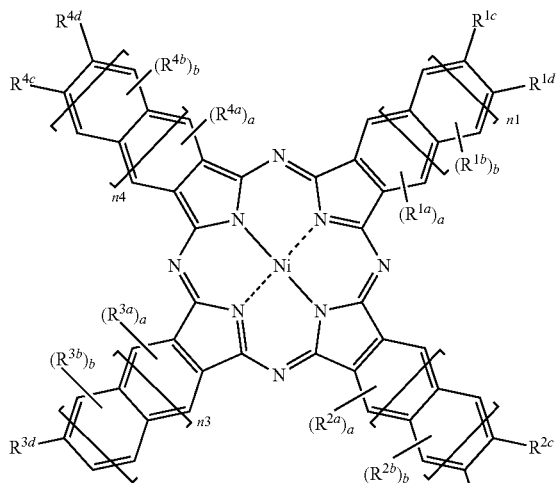

[Chemical Formula 1C]

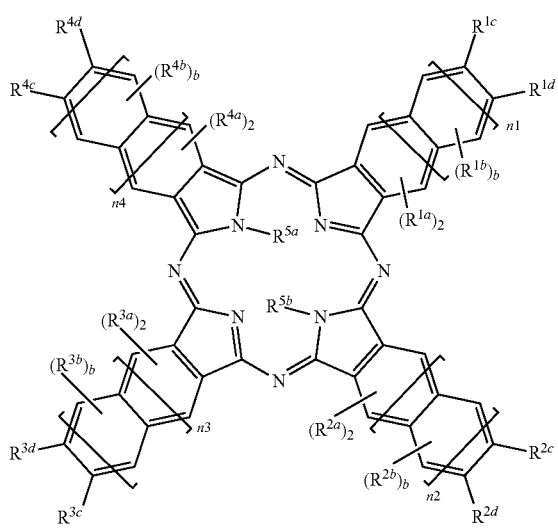

In Chemical Formulas 1A to 1C,
$R^{1a}, R^{1b}, R^{1c}, R^{1d}, R^{2a}, R^{2b}, R^{2c}, R^{2d}, R^{3a}, R^{3b}, R^{3c}, R^{3d}, R^{4a}, R^{4b}, R^{4c}, R^{4d}$, b,
n1, n2, n3, and n4 are the same as in Chemical Formula 1,
wherein, in Chemical Formula 1C,
$R^{5a}$ and $R^{5b}$ may each independently be hydrogen, a C1 to C6 alkyl group, or a C1 to C6 alkoxy group.

In some embodiments, in Chemical Formula 1, X may be Cl.

In some embodiments, in Chemical Formula 1, two $R^{1a}$'s, two $R^{2a}$'s, two $R^{3a}$'s, and two $R^{4a}$'s may be a C1 to C20 alkyl group or a C1 to C20 alkoxy group.

In some embodiments, in Chemical Formulas 2A and 2B, $Ar^{11}, Ar^{12}, Ar^{21}$, and $Ar^{22}$ each independently may be a C6 to C10 aryl group substituted with a C1 to C20 alkyl group or a C1 to C20 alkoxy group or a C3 to C10 heteroaryl group substituted with a C1 to C20 alkyl group or a C1 to C20 alkoxy group.

In some embodiments, in Chemical Formulas 2A to 2C, $Ar^{31}$ and $Ar^{32}$ may be a cyclic group represented by one of Chemical Formulas 5A to 5F.

[Chemical Formula 5A]

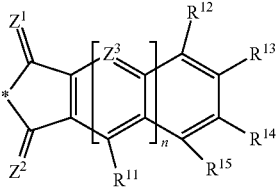

In Chemical Formula 5A,
$Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group, $Z^3$ may be N or $CR^c$, wherein $R^c$ may be hydrogen, deuterium, or a substituted or unsubstituted C1 to C10 alkyl group, $R^{11}, R^{12}, R^{13}, R^{14}$, and $R^{15}$ each independently may be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), a cyano-containing group, or a combination thereof, wherein $R^{12}, R^{13}, R^{14}$, and $R^{15}$ may each independently be present or $R^{12}$ and $R^{13}$ and $R^{14}$ and $R^{15}$ may be linked to each other to provide a fused aromatic ring, n may be 0 or 1, and

* may be a linking position.

In an embodiment, at least one of $CR^{11}, CR^{12}, CR^{13}, CR^{14}$, and $CR^{15}$ of Chemical Formula 5A may be replaced with nitrogen (N). That is, the substituted or unsubstituted benzene ring moiety of Chemical Formula 5A may include a heteroatom, for example nitrogen (N).

[Chemical Formula 5B]

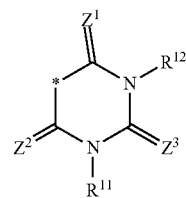

In Chemical Formula 5B,
$Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group, $Z^3$ may be O, S, Se, Te, or $C(R^a)(CN)$, wherein $R^a$ is hydrogen, a cyano group (—CN), or a C1 to C10 alkyl group, $R^{11}$ and $R^{12}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or a combination thereof, and

* may be a linking position.

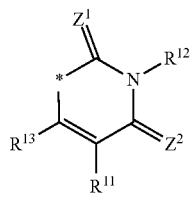

[Chemical Formula 5C]

In Chemical Formula 5C, $Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group, $R^{11}$, $R^{12}$, and $R^{13}$ each independently may be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or a combination thereof, and

* may be a linking position.

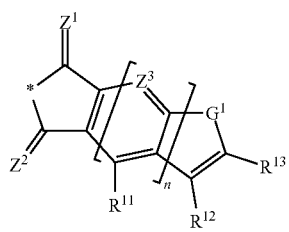

[Chemical Formula 5D]

In Chemical Formula 5D, $Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group, $Z^3$ may be N or $CR^c$, wherein $R^c$ may be hydrogen or a substituted or unsubstituted C1 to C10 alkyl group, $G^1$ may be O, S, Se, Te, $SiR^xR^y$, or $GeR^zR^w$, wherein $R^x$, $R^y$, $R^z$, and $R^w$ each independently may be hydrogen, deuterium, a halogen, a substituted or unsubstituted C1 to C20 alkyl group, or a substituted or unsubstituted C6 to C20 aryl group, $R^{11}$, $R^{12}$, and $R^{13}$ each independently may be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or a combination thereof, wherein $R^{12}$ and $R^{13}$ may each independently be present or be linked to each other to provide a fused aromatic ring, n may be 0 or 1, and

* may be a linking position.

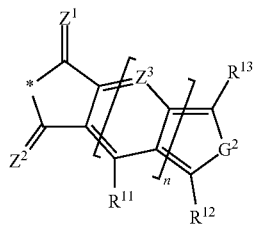

[Chemical Formula 5E]

In Chemical Formula 5E, $Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group, $Z^3$ may be N or $CR^c$, wherein $R^c$ may be hydrogen or a substituted or unsubstituted C1 to C10 alkyl group, $G^2$ may be O, S, Se, Te, $SiR^xR^y$, or $GeR^zR^w$, wherein $R^x$, $R^y$, $R^z$, and $R^w$ each independently may be hydrogen, deuterium, a halogen, a substituted or unsubstituted C1 to C20 alkyl group, or a substituted or unsubstituted C6 to C20 aryl group, $R^{11}$, $R^{12}$, and $R^{13}$ each independently may be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or a combination thereof, n may be 0 or 1, and

* may be a linking position.

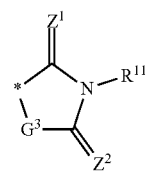

[Chemical Formula 5F]

In Chemical Formula 5F, $Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group, $R^{11}$ is hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or a combination thereof, and $G^3$ is O, S, Se, Te, $SiR^xR^y$, or $GeR^zR^w$, wherein $R^x$, $R^y$, $R^z$, and $R^w$ each independently may be hydrogen, deuterium, a halogen, a substituted or unsubstituted C1 to C20 alkyl group, or a substituted or unsubstituted C6 to C20 aryl group.

In some embodiments, the compound represented by Chemical Formula 2A may be a compound represented by Chemical Formula 2A-1.

[Chemical Formula 2A-1]

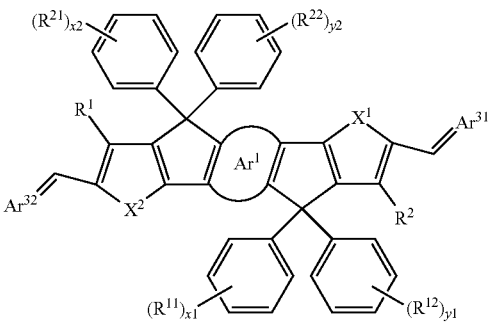

In Chemical Formula 2A-1,
$Ar^1$ may be one of the moieties represented by Chemical Formula 3,
$X^1$ and $X^2$ may each independently be S, Se, or Te,
$R^1$ and $R^2$ each independently may be hydrogen or a C1 to C10 alkyl group,
$R^{11}$, $R^{12}$, $R^{21}$, and $R^{22}$ may each independently be hydrogen, deuterium, a halogen, a substituted or unsubstituted C1 to C20 alkyl group, or a substituted or unsubstituted C6 to C20 aryl group, x1, y1, x2, and y2 may each independently be an integer from 0 to 5, and
$Ar^{31}$ and $Ar^{32}$ may each independently be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof.

In some embodiments, the compound represented by Chemical Formula 2B may be a compound represented by Chemical Formula 2B-1.

[Chemical Formula 2B-1]

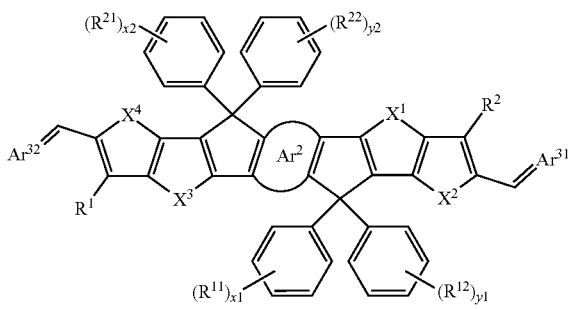

In Chemical Formula 2B3-1,
$Ar^2$ may be one of the moieties represented by Chemical Formula 3,
$X^1$, $X^2$, $X^3$, and $X^4$ may each independently be S, Se, or Te,
$R^1$ and $R^2$ each independently may be hydrogen or a C1 to C10 alkyl group,
$R^{11}$, $R^{12}$, $R^{21}$, and $R^{22}$ may each independently be hydrogen, deuterium, a halogen, a substituted or unsubstituted C1 to C20 alkyl group, or a substituted or unsubstituted C6 to C20 aryl group, x1, y1, x2, and y2 may each independently be an integer from 0 to 5, $Ar^{31}$ and $Ar^{32}$ each independently may be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof.

In some embodiments, the fullerene derivative may include a C60 to C120 fullerene substituted with a first functional group of an aryl group or a heterocyclic group and a second functional group of an alkyl ester group. The aryl group may be a phenyl group, a naphthyl group, or an anthracenyl group. The heterocyclic group may be a furyl group, a thienyl group, a pyrrolyl group, an oxazolyl group, a pyridyl group, a pyrimidyl group, a quinolyl group, or a carbazolyl group.

In some embodiments, the fullerene derivative may include [6,6]-phenyl-C61-butyric acid methyl ester (PC60BM), bis(1-[3-(methoxycarbonyl)propyl]-1-phenyl)-[6,6]C62 (bis-PCBM), phenyl-C70-butyric acid methyl ester (PC70BM), indene-C60 bisadduct (ICBA), or indene-C60 monoadduct (ICMA).

In some embodiments, the p-type semiconductor compound and the n-type semiconductor compound may be included in a volume ratio (p-type semiconductor compound:n-type semiconductor compound) of about 1:0.1 to about 1:10.

An infrared absorption composition may include the p-type semiconductor compound and the n-type semiconductor compound and may exhibit a peak absorption wavelength in a wavelength region of about 800 nm to about 3000 nm.

In some embodiments, n may be 0 in Chemical Formula 1.

In some embodiments, n may be 1 in Chemical Formula 1.

In some embodiments, n1 to n4 may be 1 in Chemical Formula 1.

In some embodiments, $X^1$, $X^2$, $X^3$, and $X^4$ may be S in Chemical Formulas 2A, 2B, and 2C.

In some embodiments, the n-type semiconductor compound may include the compound represented by Chemical Formula 2B.

According to some embodiments, a photoelectric device includes a first electrode and a second electrode facing each other, and a photoactive layer between the first electrode and the second electrode, wherein the photoactive layer includes the infrared absorption composition including the p-type semiconductor compound and the n-type semiconductor compound.

According to some embodiments, a sensor including the photoelectric device is provided.

According to some embodiments, an electronic device including the photoelectric device or the sensor is provided.

The infrared absorption composition may exhibit good light absorption properties in the infrared region and thus may be used effectively for photoelectric devices and/or sensors.

DETAILED DESCRIPTION

Figure 1:
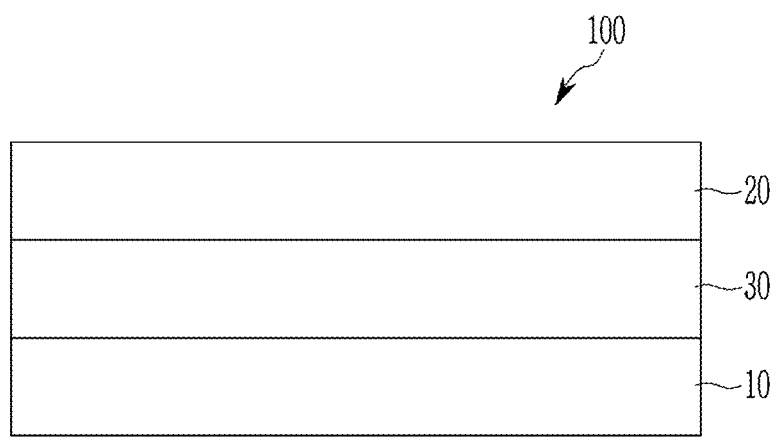
FIG. 1 is a cross-sectional view showing a photoelectric device according to some embodiments.

Hereinafter, embodiments will hereinafter be described in detail, and may be easily performed by a person having an ordinary skill in the related art. However, this disclosure may be embodied in many different forms and is not to be construed as limited to the embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, "combination" includes a mixture of two or more, inter-substitution, and a laminate structure of two or more.

As used herein, when specific definition is not otherwise provided, "substituted" refers to replacement of a hydrogen of a compound or a functional group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when specific definition is not otherwise provided, "'hetero" refers to one including 1 to 4 heteroatoms selected from N, O, S, Se, Te, Si, and P.

As used herein, when a definition is not otherwise provided, "aromatic ring" refers to a functional group in which all atoms in the cyclic functional group have a p-orbital, and wherein these p-orbitals are conjugated and "heteroaromatic ring" refers to the aromatic ring including a heteroatom. The "aromatic ring" refers to a C6 to C30 arene group, for example a C6 to C20 arene group or a C6 to C30 aryl group, for example a C6 to C20 aryl group. The "heteroaromatic ring" refers to a C3 to C30 heteroarene group, for example a C3 to C20 heteroarene group or a C3 to C30 heteroaryl group, for example a C3 to C20 heteroaryl group.

As used herein, "arene group" refers to a hydrocarbon group having an aromatic ring, and includes monocyclic and polycyclic hydrocarbon groups, and the additional ring of the polycyclic hydrocarbon group may be an aromatic ring or a nonaromatic ring. "Heteroarene group" means an arene group including 1 to 3 heteroatoms selected from N, O, S, Se, Te, P, and Si in the ring.

As used herein, when a definition is not otherwise provided, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like; a group in which two or more hydrocarbon aromatic moieties may be linked by a sigma bond, for example a biphenyl group, a terphenyl group, a quarterphenyl group, and the like; and a group in which two or more hydrocarbon aromatic moieties are fused directly or indirectly to provide a non-aromatic fused ring, for example a fluorenyl group. The aryl group may include a monocyclic, polycyclic or fused polycyclic (i.e., rings sharing adjacent pairs of carbon atoms) functional group.

As used herein, when a definition is not otherwise provided, "heteroaryl group" refers to an aryl group including at least one heteroatom selected from N, O, S, Se, Te, P, and Si instead of carbon (C) in the ring. When the heteroaryl group is a fused ring, is a fused ring, at least one of rings of the heteroaryl group may have a heteroatom or each ring may have a heteroatom.

As used herein, when a definition is not otherwise provided, "halogen" may be one of F, Cl, Br, or I and the haloalkyl group may be an alkyl group in which at least one hydrogen is replaced by a halogen and may be, for example, a perfluoroalkyl group such as $-CF_3$.

As used herein, "hydrocarbon cyclic group" may include an aromatic ring (arene ring) or a fused ring of an aromatic ring and a nonaromatic ring (alicyclic ring). The aromatic ring may include may include, for example, a C6 to C30 aryl group, a C6 to C20 aryl group, or a C6 to C10 aryl group and the fused ring may include a fused ring which is formed by linking at least one aromatic ring (arene ring) such as a C6 to C30 aryl group, a C6 to C20 aryl group, or a C6 to C10 aryl group with at least one nonaromatic ring (alicyclic ring) such as a C3 to C30 cycloalkyl group, a C3 to C20 cycloalkyl group, or a C3 to C10 cycloalkyl group. The aromatic ring or nonaromatic ring (alicyclic ring) may include a heteroatom (e.g., N, O, S, Se, Te, P, and/or Si) in the ring.

As used herein, "heterocyclic group" refers to a cyclic group including a heteroatom selected from N, O, S, Se, Te, P, and Si instead of 1 to 3 carbon atoms in a cyclic group selected from an aromatic hydrocarbon group (e.g., a C6 to C30 aryl group, a C6 to C20 aryl group, or a C6 to C10 aryl group), an alicyclic hydrocarbon group (e.g., a C3 to C30 cycloalkyl group, a C3 to C20 cycloalkyl group, or a C3 to C10 cycloalkyl group), or a fused ring thereof. At least one carbon atom of the heterocyclic group may also be replaced by a thiocarbonyl group (C=S).

As used herein, "fused ring" refers to a condensed ring formed by bonding two or more cyclic groups selected from an aromatic hydrocarbon group (e.g., a C6 to C30 aryl group, a C6 to C20 aryl group, or a C6 to C10 aryl group) and an alicyclic hydrocarbon group (e.g., a C3 to C30 cycloalkyl group, a C3 to C20 cycloalkyl group, or a C3 to C10 cycloalkyl group).

As used herein, when a definition is not otherwise provided, "cyano-containing group" refers to a monovalent group such as a C1 to C30 alkyl group, a C2 to C30 alkenyl group, or a C2 to C30 alkynyl group where at least one hydrogen is replaced by a cyano group. The cyano-containing group also refers to a divalent group such as =$CR^{x'}$—$(CR^xR^y)_p$—$CR^{y'}(CN)_2$ wherein $R^x$, $R^y$, $R^{x'}$, and $R^{y'}$ are independently hydrogen or a C1 to C10 alkyl group and p may be an integer of 0 to 10 (or 1 to 10). Specific examples of the cyano-containing group may be a dicyanomethyl group, a dicyanovinyl group, a cyanoethynyl group, and the like.

As used herein, when a definition is not otherwise provided, the "infrared wavelength region" includes a near-infrared/infrared wavelength region with a wavelength region of about 800 nm to about 3000 nm.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following: A; B; A and B; A and C; B and C; and A, B, and C.

Hereinafter, an infrared absorption composition according to some embodiments is described. The infrared absorption composition includes a p-type semiconductor compound and an n-type semiconductor compound and the p-type semiconductor compound and the n-type semiconductor compound provide a bulk heterojunction (BHJ) structure.

The p-type semiconductor compound may be represented by Chemical Formula 1.

In Chemical Formula 1,

M may be Sn, Ni, V, Al, Zn, Si, Co, or Ge,

X may be a halogen (e.g., F, Cl, Br, or I), m may be an integer from 0 to 4, for example 0, 1, or 2, n may be 0 or 1, two $R^{1a}$'s, two $R^{2a}$'s, two $R^{3a}$'s, and two $R^{4a}$'s may be each the same as or different from each other and may each independently be hydrogen, deuterium, a halogen, a cyano group (—CN), a C1 to C20 haloalkyl group, a C1 to C20 cyanoalkyl group, a C1 to C20 alkyl group, or a C1 to C20 alkoxy group, provided that at least one of two $R^{1a}$'s, at least one of two $R^{2a}$'s, at least one of two $R^{3a}$'s, and at least one of two $R^{4a}$'s are a C1 to C20 alkyl group or a C1 to C20 alkoxy group, $R^{1b}$, $R^{1c}$, $R^{1d}$, $R^{2b}$, $R^{2c}$, $R^{2d}$, $R^{3b}$, $R^{3c}$, $R^{3d}$, $R^{4b}$, $R^{4c}$, and $R^{4d}$ may each independently be hydrogen, deuterium, a halogen, a C1 to C20 haloalkyl group, a cyano group (—CN), a C1 to C20 cyanoalkyl group, a C1 to C20 alkyl group, or a C1 to C20 alkoxy group, b may be an integer of 0 to 2, and n1, n2, n3, and n4 may each independently be an integer from 1 to 4.

In some embodiment, in Chemical Formula 1, when M is Sn, $MX_m$ may be $SnX_2$; when M is Ni, $MX_m$ may be Ni; when M is V, $MX_m$ may be $VX_2$; when M is Al, $MX_m$ may be AlX; when M is Zn, $MX_m$ may be Zn; when M is Si, $MX_m$ may be $SiX_2$; when M is Co, $MX_m$ may be Co; and when M is Ge, $MX_m$ may be $GeX_2$.

The p-type semiconductor compound represented by Chemical Formula 1 may be one of compounds represented by Chemical Formulas 1A to 1C.

[Chemical Formula 1]

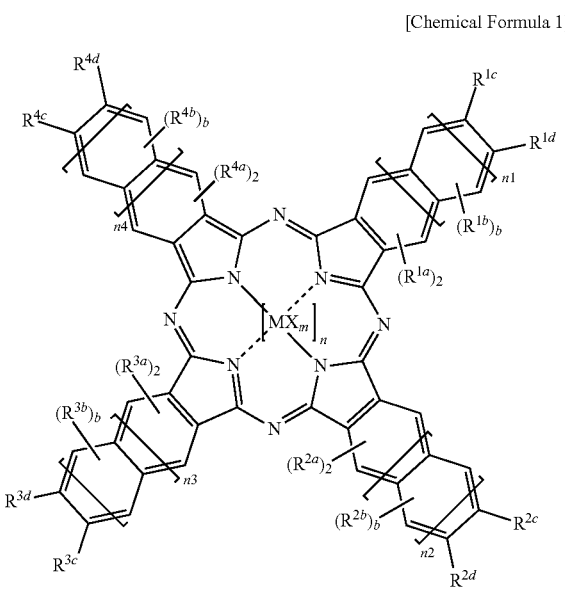

[Chemical Formula 1A]

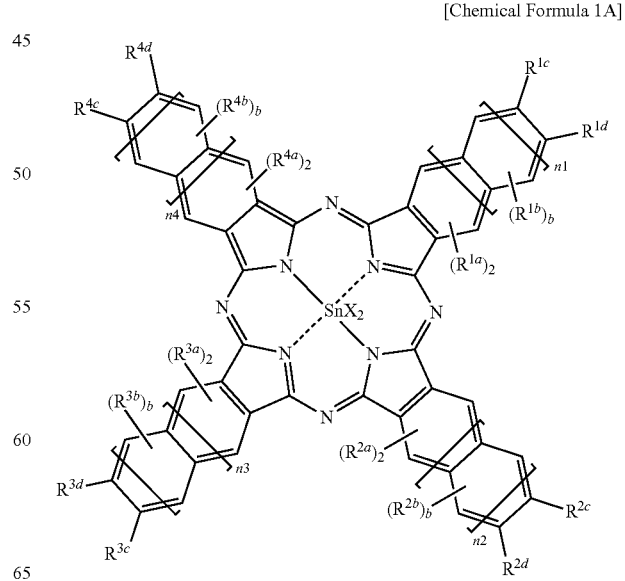

[Chemical Formula 1B]

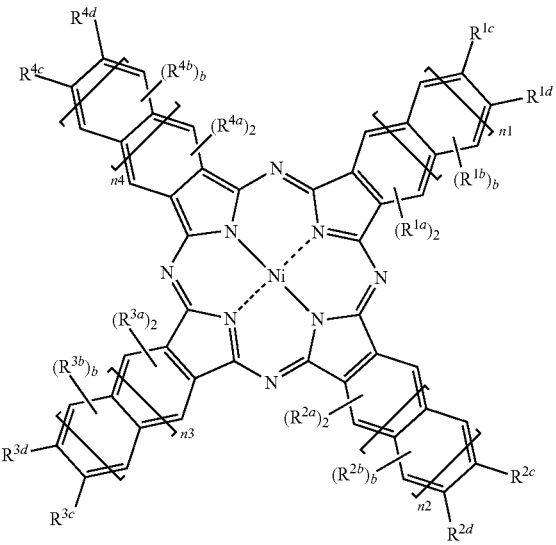

[Chemical Formula 1C]

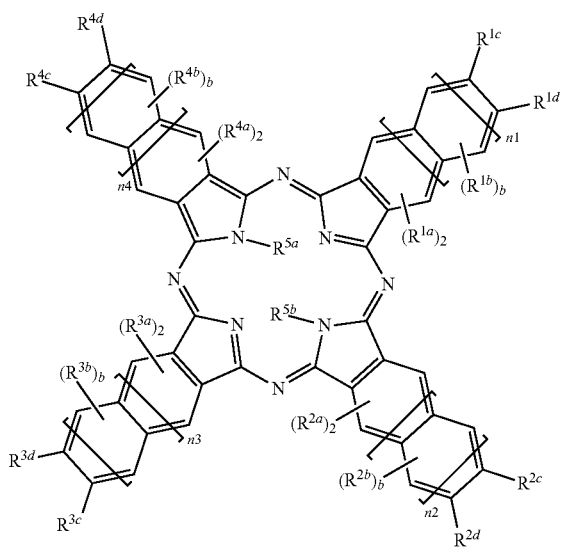

In Chemical Formulas 1A to 1C, $R^{1a}$, $R^{1b}$, $R^{1c}$, $R^{1d}$, $R^{2a}$, $R^{2b}$, $R^{2c}$, $R^{2d}$, $R^{3a}$, $R^{3b}$, $R^{3c}$, $R^{3d}$, $R^{4a}$, $R^{4b}$, $R^{4c}$, $R^{4d}$, b, n1, n2, n3, and n4 are the same as in Chemical Formula 1, wherein, in Chemical Formula 1C, $R^{5a}$ and $R^{5b}$ may be hydrogen, a C1 to C6 alkyl group, or a C1 to C6 alkoxy group.

In Chemical Formula 1 or Chemical Formula 1A, X may be Cl.

In Chemical Formula 1 or Chemical Formula 1A, two $R^{1a}$'s may be the same or different and may each independently be selected from hydrogen, deuterium, a halogen, a cyano group, a C1 to C20 haloalkyl group, a C1 to C20 cyanoalkyl group, a C1 to C20 alkyl group, or a C1 to C20 alkoxy group, provided that at least one of two $R^{1a}$'s (e.g., both two $R^{1a}$'s) may be a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., butoxy group). In Chemical Formula 1 or Chemical Formula 1A, two $R^{2a}$'s may be the same or different and may each independently be selected from hydrogen, deuterium, a halogen, a cyano group, a C1 to C20 haloalkyl group, a C1 to C20 cyanoalkyl group, a C1 to C20 alkyl group, or a C1 to C20 alkoxy group, provided that at least one of two $R^{2a}$'s (e.g., both two $R^{2a}$'s) may be a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., butoxy group). In Chemical Formula 1 or Chemical Formula 1A, two $R^{3a}$'s may be the same or different and may each independently be selected from hydrogen, deuterium, a halogen, a cyano group, a C1 to C20 haloalkyl group, a C1 to C20 cyanoalkyl group, a C1 to C20 alkyl group, or a C1 to C20 alkoxy group, provided that at least one of two $R^{3a}$'s (e.g., both two $R^{3a}$'s) may be a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., butoxy group). In Chemical Formula 1 or Chemical Formula 1A, two $R^{4a}$'s may be the same or different and may each independently be selected from hydrogen, deuterium, a halogen, a cyano group, a C1 to C20 haloalkyl group, a C1 to C20 cyanoalkyl group, a C1 to C20 alkyl group, or a C1 to C20 alkoxy group, provided that at least one of two $R^{4a}$'s (e.g., both two $R^{4a}$'s) may be a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., butoxy group).

Specific examples of the compound represented by Chemical Formula 1 may include one of compounds represented by Chemical Formula 1A-1, Chemical Formula 1B-1, or Chemical Formula 1C-1.

[Chemical Formula 1A-1]

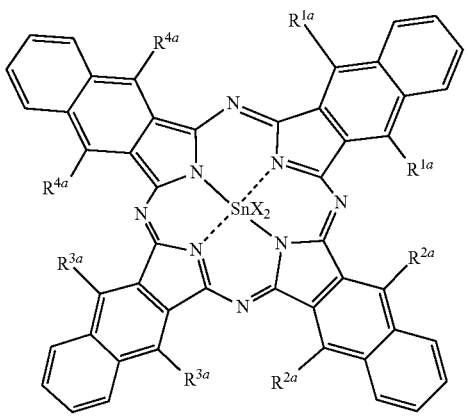

In Chemical Formula 1A-1,

X is a halogen (e.g., F, Cl, Br, or I), two $R^{1a}$'s, two $R^{2a}$'s, two $R^{3a}$'s, and two $R^{4a}$'s may be each the same as or different from each other and may each independently be hydrogen, deuterium, a halogen, a cyano group, a C1 to C20 haloalkyl group, a C1 to C20 cyanoalkyl group, a C1 to C20 alkyl group, or a C1 to C20 alkoxy group, provided that at least one of two $R^{1a}$'s, at least one of two $R^{2a}$'s, at least one of two $R^{3a}$'s, and at least one of two $R^{4a}$'s are a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., a butoxy group). In some embodiments, two $R^{1a}$'s, two $R^{2a}$'s, two $R^{3a}$'s, and two $R^{4a}$'s may each independently be a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., a butoxy group).

[Chemical Formula 1B-1]

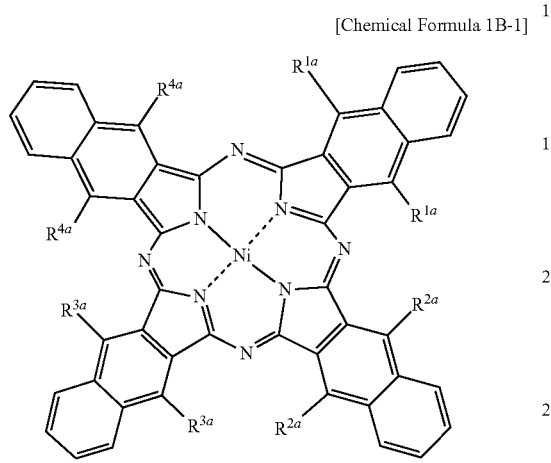

In Chemical Formula 1B-1,
two $R^{1a}$'s, two $R^{2a}$'s, two $R^{3a}$'s, and two $R^{4a}$'s may be each the same as or different from each other and may each independently be hydrogen, deuterium, a halogen, a cyano group, a C1 to C20 haloalkyl group, a C1 to C20 cyanoalkyl group, a C1 to C20 alkyl group, or a C1 to C20 alkoxy group, provided that at least one of two $R^{1a}$'s, at least one of two $R^{2a}$'s, at least one of two $R^{3a}$'s, and at least one of two $R^{4a}$'s are a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., a butoxy group). In some embodiments, two $R^{1a}$'s, two $R^{2a}$'s, two $R^{3a}$'s, and two $R^{4a}$'s may each independently be a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., a butoxy group).

[Chemical Formula 1C-1]

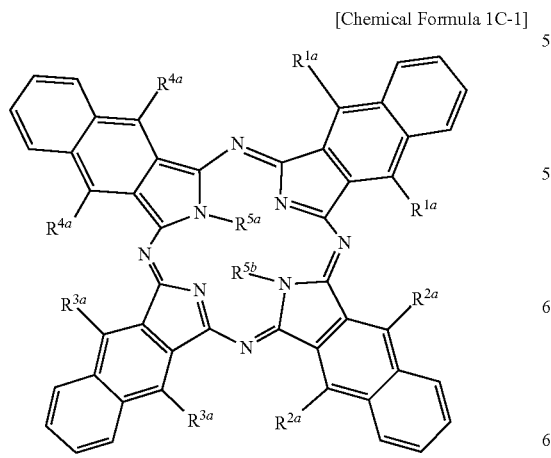

In Chemical Formula 1C-1,
$R^{5a}$ and $R^{5b}$ may each independently be hydrogen, a C1 to C6 alkyl group, or a C1 to C6 alkoxy group, and
two $R^{1a}$'s, two $R^{2a}$'s, two $R^{3a}$'s, and two $R^{4a}$'s may be each the same as or different from each other and may each independently be hydrogen, deuterium, a halogen, a cyano group, a C1 to C20 haloalkyl group, a C1 to C20 cyanoalkyl group, a C1 to C20 alkyl group, or a C1 to C20 alkoxy group, provided that at least one of two $R^{1a}$'s, at least one of two $R^{2a}$'s, at least one of two $R^{3a}$'s, and at least one of two $R^{4a}$'s are a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., a butoxy group). In some embodiments, two $R^{1a}$'s, two $R^{2a}$'s, two $R^{3a}$'s, and two $R^{4a}$'s may each independently be a C1 to C20 alkyl group, for example a C1 to C15 alkyl group or a C3 to C10 alkyl group or a C1 to C20 alkoxy group, for example a C1 to C15 alkoxy group or a C3 to C10 alkoxy group (e.g., a butoxy group).

The n-type semiconductor compound may include a compound represented by Chemical Formula 2A, a compound represented by Chemical Formula 2B, a compound represented by Chemical Formula 2C, a fullerene derivative, or a combination thereof.

[Chemical Formula 2A]

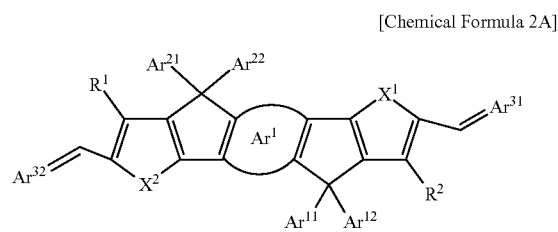

In Chemical Formula 2A,
$Ar^1$ may be one of the moieties represented by Chemical Formula 3,
$X^1$ and $X^2$ may each independently be S, Se, or Te,
$Ar^{11}$, $Ar^{12}$, $Ar^{21}$, and $Ar^{22}$ may each independently be a substituted or unsubstituted C6 to C10 aryl group or a substituted or unsubstituted C3 to C10 heteroaryl group,
$Ar^{31}$ and $Ar^{32}$ may each independently be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and
$R^1$ and $R^2$ may each independently be hydrogen or a C1 to C10 alkyl group:

[Chemical Formula 3]

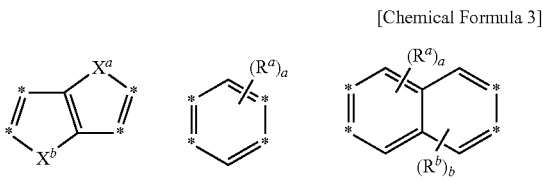

-continued

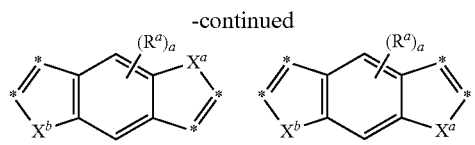

wherein, in Chemical Formula 3,
$X^a$ and $X^b$ may each independently be S, Se, or Te,
$R^a$ and $R^b$ may each independently be hydrogen or a C1 to C20 alkyl group (e.g., a C1 to C15 alkyl group or a C1 to C10 alkyl group), and
a and b may each independently be 1 or 2.

[Chemical Formula 2B]

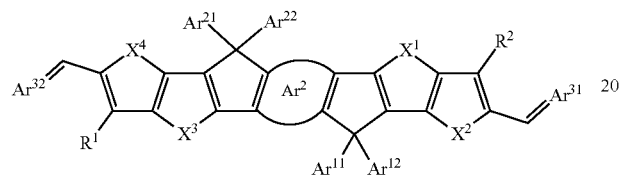

In Chemical Formula 2B,
$Ar^2$ may be one of the moieties represented by Chemical Formula 3,
$X^1$, $X^2$, $X^3$, and $X^4$ may each independently be S, Se, or Te,
$Ar^{11}$, $Ar^{12}$, $Ar^{21}$, and $Ar^{22}$ may each independently be a substituted or unsubstituted C6 to C10 aryl group or a substituted or unsubstituted C3 to C10 heteroaryl group,
$Ar^{31}$ and $Ar^{32}$ may each independently be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and
$R^1$ and $R^2$ may each independently be hydrogen or a C1 to C10 alkyl group.

[Chemical Formula 2C]

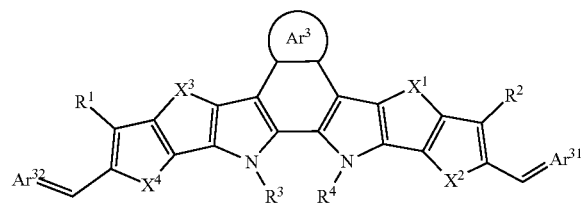

In Chemical Formula 2C,
$Ar^3$ may be one of the moieties represented by Chemical Formula 4,
$X^1$, $X^2$, $X^3$, and $X^4$ may each independently be S, Se, or Te,
$R^3$ and $R^4$ may each independently be hydrogen, a C1 to C20 alkyl group, a C6 to C10 aryl group, or a C2 to C10 heteroaryl group,
$Ar^{31}$ and $Ar^{32}$ may each independently be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and
$R^1$ and $R^2$ may each independently be hydrogen or a C1 to C20 alkyl group (e.g., a C1 to C15 alkyl group or a C1 to C10 alkyl group).

[Chemical Formula 4]

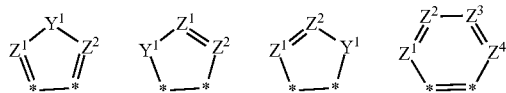

In Chemical Formula 4,
$Y^1$ may be $CR^pR^q$, $NR^r$, O, S, Se, or Te, wherein $R^p$, $R^q$, and $R^r$ may each independently be hydrogen or a C1 to C20 alkyl group (e.g., a C1 to C15 alkyl group or a C1 to C10 alkyl group), and
$Z^1$ to $Z^4$ may each independently be $CR^s$ or N, wherein, $R^s$ is hydrogen or a C1 to C20 alkyl group (e.g., a C1 to C15 alkyl group or a C1 to C10 alkyl group).
In Chemical Formula 4, at least one of $Z^1$ and $Z^2$ and/or at least one of $Z^1$ to $Z^4$, for example at least two, may be N.
The moiety represented by Chemical Formula 4 may be one of the moieties represented by Chemical Formula 4A.

[Chemical Formula 4A]

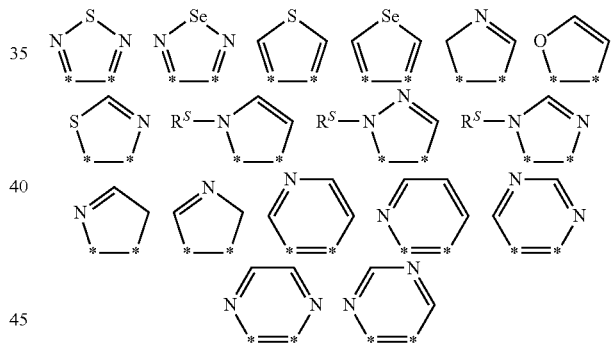

In Chemical Formula 4A,
$R^s$ may be hydrogen or a C1 to C20 alkyl group (e.g., a C1 to C15 alkyl group or a C1 to C10 alkyl group).
In Chemical Formulas 2A and 2B, $Ar^{11}$, $Ar^{12}$, $Ar^{21}$, and $Ar^{22}$ may each independently be a C6 to C10 aryl group substituted with a C1 to C20 (e.g., C4 to C15 or C4 to C10) alkyl group or a C1 to C20 (e.g., C4 to C15 or C4 to C10) alkoxy group; or a C3 to C10 heteroaryl group substituted with a C1 to C20 (e.g., C4 to C15 or C4 to C10) alkyl group or a C1 to C20 (e.g., C4 to C15 or C4 to C10) alkoxy group.
In some embodiments, $R^3$ and $R^4$ of Chemical Formula 2C may each independently be a substituted or unsubstituted branched C3 to C20 alkyl group (e.g., an isopropyl group, an isobutyl group, a 2-ethylpentyl group, a 2-propylpentyl group, a 2-propyloctyl group, a t-butyl group, an isopentyl group, neopentyl group, a 2-ethylbutyl group, a 2-methylpentyl group, a 3-methylpentyl group, a 2,3-dimethylbutyl group, a 3-ethylpentyl group, a 2-methylhexyl group, a 2,3-dimethylpentyl group, a 2,4-dimethylpentyl group, a 2-methyloctyl group, a 2-ethyloctyl group, a 4-methyloctyl group, a 3,3-dimethyloctyl group, a 4-ethyloctyl group, a 2-methylheptyl group, a 3-methylheptyl group, a 4-methylheptyl group, a 2-ethylhexyl group, a 3-ethylhexyl group, a 2,2,4-trimethylpentyl group, a 2,4-dimethylhexyl group, a 2-methyl-3-ethylpentyl group, a 3-methyl-4-methylhexyl group, a 3,3,4-trimethylhexyl group, a 3,4,5-trimethylhexyl group, a 4-ethylheptyl group, a 5-methylnonyl group, a 3-methyl-2-ethylheptyl group, a 1-methylnonyl group, a 2,3,5-trimethylheptyl group, a 3-methyl-4-ethylheptyl group, a 2,2,3,3-tetramethylhexyl group, a 4-propylheptyl group, or a 2,4-dimethyl-3-ethylhexyl group).

In Chemical Formulas 2A to 2C, $Ar^{31}$ and $Ar^{32}$ may be a cyclic group represented by one of Chemical Formulas 5A to 5F.

[Chemical Formula 5A]

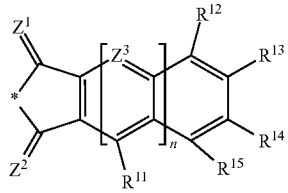

In Chemical Formula 5A,
$Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group,
$Z^3$ may be N or $CR^c$, wherein $R^c$ may be hydrogen, deuterium, or a substituted or unsubstituted C1 to C10 alkyl group,
$R^{11}$, $R^{12}$, $R^{13}$, $R^{14}$, and $R^{15}$ may be the same or different and may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, halogen (F, Cl, Br, or I), a cyano group (—CN), a cyano-containing group, or a combination thereof, wherein $R^{12}$, $R^{13}$, $R^{14}$, and $R^{15}$ may each independently be present or $R^{12}$ and $R^{13}$ and $R^{14}$ and $R^{15}$ may be linked to each other to provide a fused aromatic ring,
n may be 0 or 1, and
* may be a linking position.

[Chemical Formula 5B]

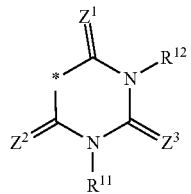

In Chemical Formula 5B,
$Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group,
$Z^3$ may be O, S, Se, Te, or $C(R^a)(CN)$, wherein $R^a$ is hydrogen, a cyano group (—CN), or a C1 to C10 alkyl group, $R^{11}$ and $R^{12}$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen (F, Cl, Br, or I), a cyano group (—CN), or a combination thereof, and
* may be a linking position.

[Chemical Formula 5C]

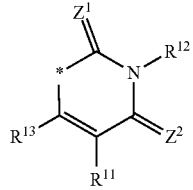

In Chemical Formula 5C,
$Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group,
$R^{11}$, $R^{12}$, and $R^{13}$ may be the same or different and may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or a combination thereof, and
* may be a linking position.

[Chemical Formula 5D]

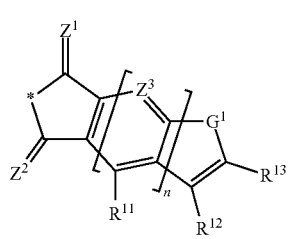

In Chemical Formula 5D,
$Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group,
$Z^3$ may be N or $CR^c$, wherein $R^c$ may be hydrogen or a substituted or unsubstituted C1 to C10 alkyl group,
$G^1$ may be O, S, Se, Te, $SiR^xR^y$, or $GeR^zR^w$, wherein $R^x$, $R^y$, $R^z$, and $R^w$ may be the same or different and may each independently be hydrogen, deuterium, a halogen, a substituted or unsubstituted C1 to C20 alkyl group, or a substituted or unsubstituted C6 to C20 aryl group,
$R^{11}$, $R^{12}$, and $R^{13}$ may be the same or different and may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen (F, Cl, Br, or I), a cyano-containing group, or a combination thereof, wherein $R^{12}$ and $R^{13}$ may each independently be present or be linked to each other to provide a fused aromatic ring,
n may be 0 or 1, and
* may be a linking position.

[Chemical Formula 5E]

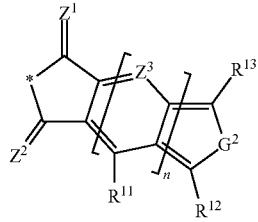

In Chemical Formula 5E,
$Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group,
$Z^3$ may be N or $CR^c$, wherein $R^c$ may be hydrogen or a substituted or unsubstituted C1 to C10 alkyl group,
$G^2$ may be O, S, Se, Te, $SiR^xR^y$, or $GeR^zR^w$, wherein $R^x$, $R^y$, $R^z$, or $R^w$ may be the same or different and may each independently be hydrogen, deuterium, a halogen (F, Cl, Br, or I), a substituted or unsubstituted C1 to C20 alkyl group, or a substituted or unsubstituted C6 to C20 aryl group,
$R^{11}$, $R^{12}$, and $R^{13}$ may be the same or different and may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen (F, Cl, Br, or I), a cyano group, a cyano-containing group, or a combination thereof,
n may be 0 or 1, and
* may be a linking position.

[Chemical Formula 5F]

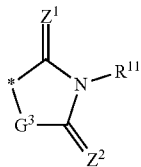

In Chemical Formula 5F,
$Z^1$ and $Z^2$ may each independently be O, S, Se, Te, or $CR^aR^b$, wherein $R^a$ and $R^b$ may each independently be hydrogen, a substituted or unsubstituted C1 to C10 alkyl group, or a cyano group,
$R^{11}$ may be hydrogen, deuterium, a substituted or unsubstituted C1 to C30 alkyl group, a substituted or unsubstituted C6 to C30 aryl group, a substituted or unsubstituted C4 to C30 heteroaryl group, a halogen (F, Cl, Br, or I), a cyano group (—CN), a cyano-containing group, or a combination thereof, and
$G^3$ may be O, S, Se, Te, $SiR^xR^y$, or $GeR^zR^w$, wherein $R^x$, $R^y$, $R^z$, and $R^w$ may be the same or different and may each independently be hydrogen, deuterium, a halogen (F, Cl, Br, or I), a substituted or unsubstituted C1 to C20 alkyl group, or a substituted or unsubstituted C6 to C20 aryl group.

In some embodiments, the compound represented by Chemical Formula 2A may be a compound represented by Chemical Formula 2A-1.

[Chemical Formula 2A-1]

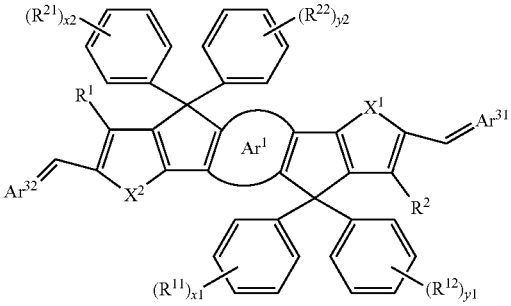

In Chemical Formula 2A-1,
$Ar^1$ may be one of the moieties represented by Chemical Formula 3,
$X^1$ and $X^2$ may each independently be S, Se, or Te,
$R^1$ and $R^2$ each independently may be hydrogen or a C1 to C10 alkyl group,
$R^{11}$, $R^{12}$, $R^{21}$, and $R^{22}$ may each independently be hydrogen, deuterium, a halogen, a substituted or unsubstituted C1 to C20 alkyl group, or a substituted or unsubstituted C6 to C20 aryl group, x1, y1, x2, and y2 may each independently be an integer from 0 to 5, and
$Ar^{31}$ and $Ar^{32}$ may each independently be a substituted or unsubstituted C6 to C30 hydrocarbon cyclic group having at least one functional group selected from C═O, C═S, C═Se, C═Te, and C═$(CN)_2$, a substituted or unsubstituted C2 to C30 heterocyclic group having at least one functional group selected from C═O, C═S, C═Se, C═Te, and C═$(CN)_2$, or a fused ring thereof.
In Chemical Formula 2A-1, $Ar^{31}$ and $Ar^{32}$ may be a cyclic group represented by one of Chemical Formulas 5A to 5F.
In Chemical Formula 2A-1, $R^{11}$, $R^{12}$, $R^{21}$, and $R^{22}$ may exist in the para position of the benzene ring.
The compound represented by Chemical Formula 2B may be a compound represented by Chemical Formula 2B-1.

[Chemical Formula 2B-1]

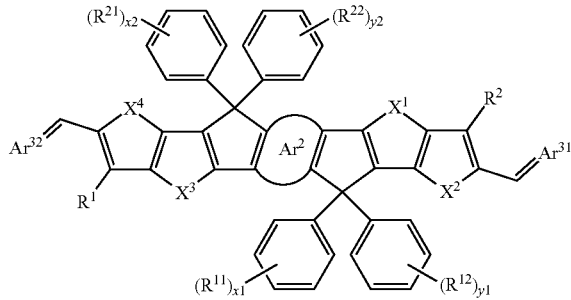

In Chemical Formula 2B-1,
$Ar^2$ may be one of the moieties represented by Chemical Formula 3,
$X^1$, $X^2$, $X^3$, and $X^4$ may each independently be S, Se, or Te,
$R^1$ and $R^2$ each independently may be hydrogen or a C1 to C10 alkyl group, $R^{11}$, $R^{12}$, $R^{21}$, and $R^{22}$ may each independently be hydrogen, deuterium, a halogen, a substituted or unsubstituted C1 to C20 alkyl group, or a substituted or unsubstituted C6 to C20 aryl group, x1, y1, x2, and y2 may each independently be an integer from 0 to 5, $Ar^{31}$ and $Ar^{32}$ may each independently be a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof.

In Chemical Formula 2B-1, $Ar^{31}$ and $Ar^{32}$ may be a cyclic group represented by one of Chemical Formulas 5A to 5F.

In Chemical Formula 2B-1, $R^{11}$, $R^{12}$, $R^{21}$, and $R^{22}$ may exist in the para position of the benzene ring.

The compound represented by Chemical Formula 2A may include a compound represented by one of Chemical Formula 2A-1a to 2A-1d.

[Chemical Formula 2A-1a]

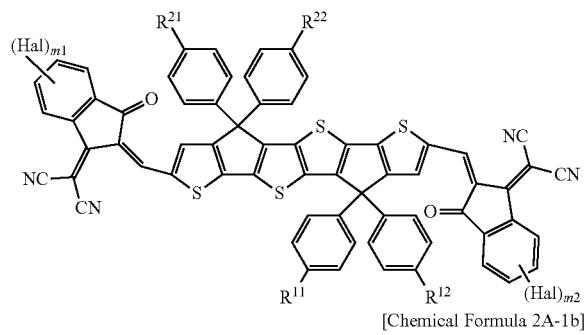

[Chemical Formula 2A-1b]

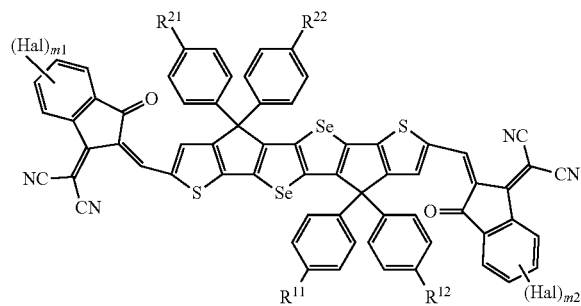

[Chemical Formula 2A-1c]

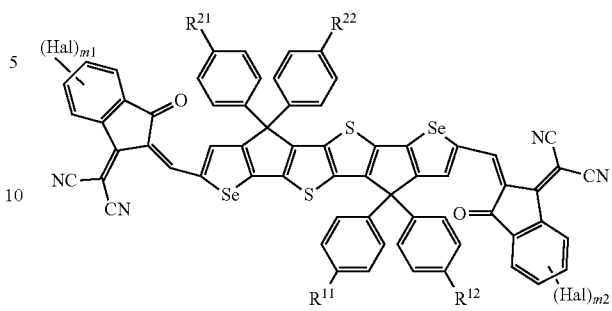

[Chemical Formula 2A-1d]

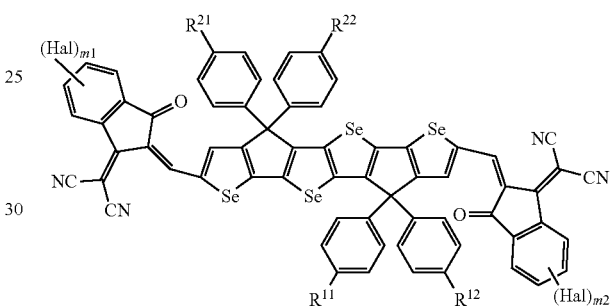

In Chemical Formulas 2A-1a to 2A-1d, $R^{11}$, $R^{12}$, $R^{21}$, and $R^{22}$ may each independently be hydrogen, deuterium, a halogen, a substituted or unsubstituted C1 to C20 (e.g., C4 to C10 or C6 to C8) alkyl group, or a substituted or unsubstituted C6 to C20 (e.g., C6 to C10 or C6 to C8 aryl group, Hal indicates a halogen (e.g., F, Cl, Br, or I), and m1 and m2 may be integers from 0 to 4 (e.g., 0 to 2).

The compound represented by Chemical Formula 2A may be a compound represented by one of Chemical Formula 2A-2a and Chemical Formula 2A-2b.

[Chemical Formula 2A-2a]

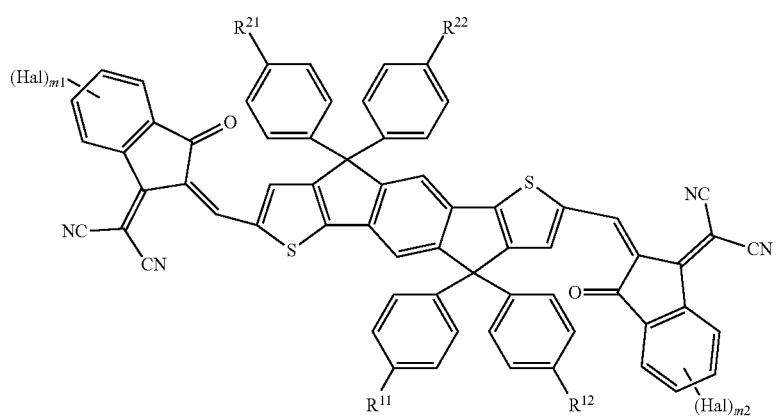

-continued

[Chemical Formula 2A-2b]

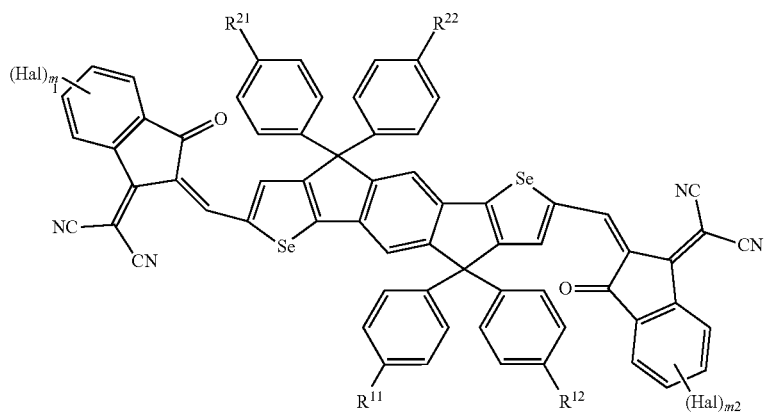

In Chemical Formulas 2A-2a and 2A-2b, $R^{11}$, $R^{12}$, $R^{21}$, and $R^{22}$ may each independently be hydrogen, deuterium, a halogen, a substituted or unsubstituted C1 to C20 (e.g., C4 to C10 or C6 to C8) alkyl group, or a substituted or unsubstituted C6 to C20 (e.g., C6 to C10 or C6 to C8) aryl group, Hal indicates a halogen (e.g., F, Cl, Br, or I), and m1 and m2 may be integers from 0 to 4 (e.g., 0 to 2).

The compound of Chemical Formula 2A-1a may be a compound of Chemical Formula 2A-1aa.

[Chemical Formula 2A-1aa]

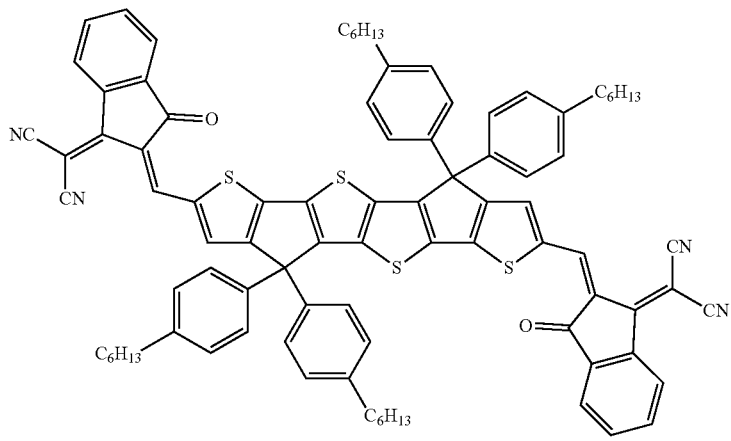

The compound represented by Chemical Formula 2B may be a compound represented by one of Chemical Formulas 2B-1a to 2B-1d.

[Chemical Formula 2B-1a]
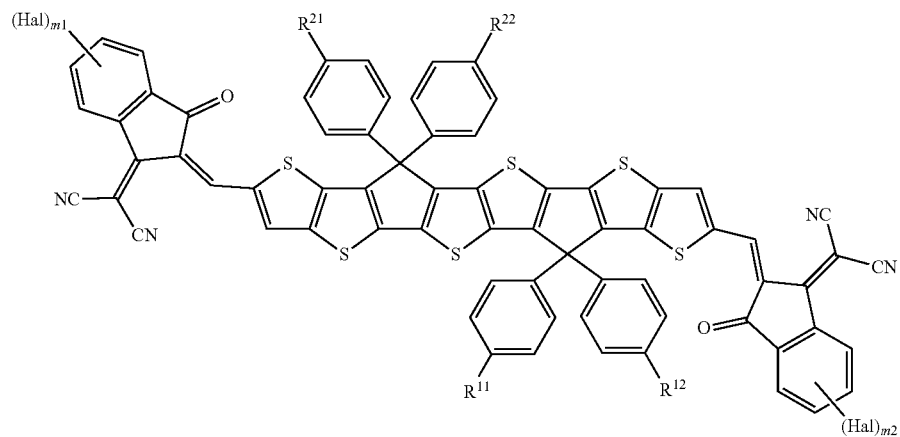
[Chemical Formula 2B-1b]
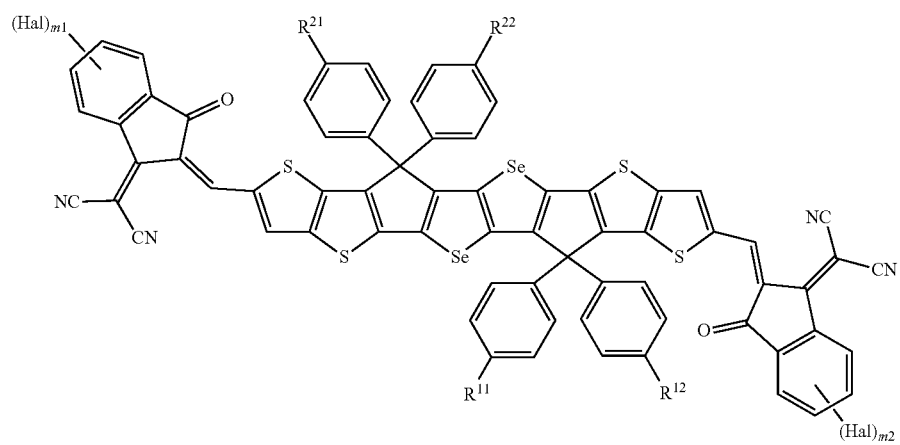
[Chemical Formula 2B-1c]
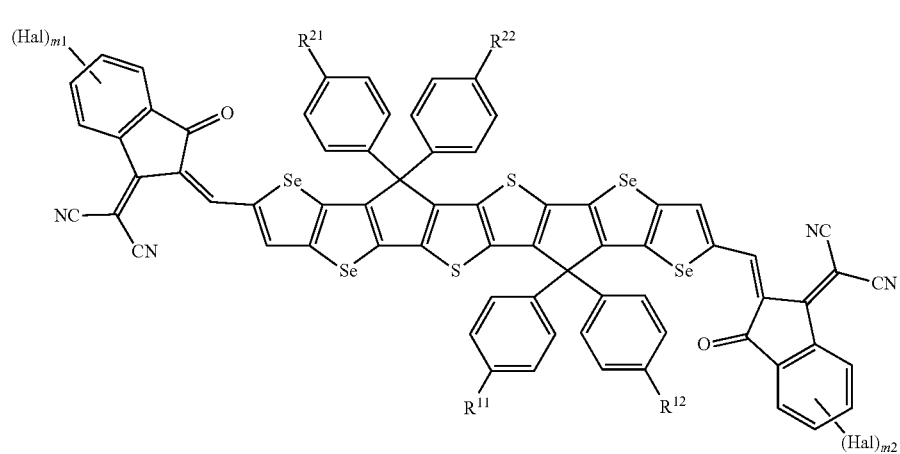

[Chemical Formula 2B-1d]

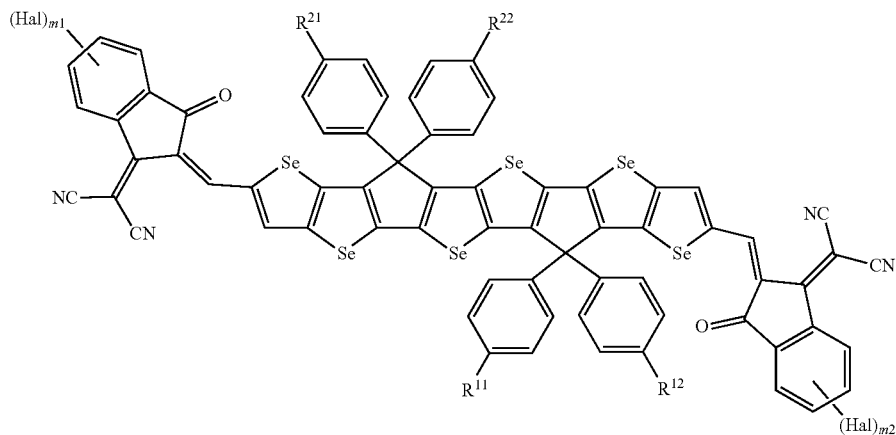

In Chemical Formulas 2B-1a to 2B-1d,
$R^{11}$, $R^{12}$, $R^{21}$, and $R^{22}$ may each independently be hydrogen, deuterium, a halogen, a substituted or unsubstituted C1 to C20 (e.g., C4 to C10 or C6 to C8) alkyl group, or a substituted or unsubstituted C6 to C20 (e.g., C6 to C10 or C6 to C8) aryl group, Hal indicates a halogen (e.g., F, Cl, Br, or I), and m1 and m2 may be integers from 0 to 4 (e.g., 0 to 2).

The compound represented by Chemical Formula 2B may be a compound represented by Chemical Formula 2B-2a or 2B-2b.

[Chemical Formula 2B-2a]

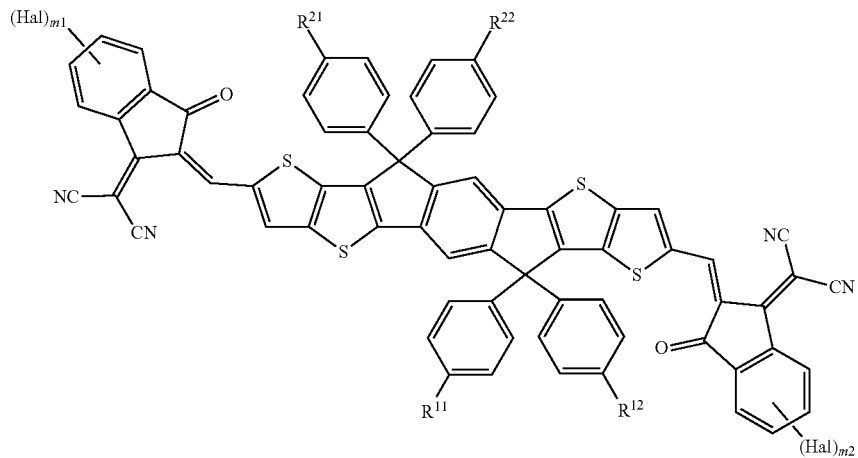

[Chemical Formula 2B-2b]

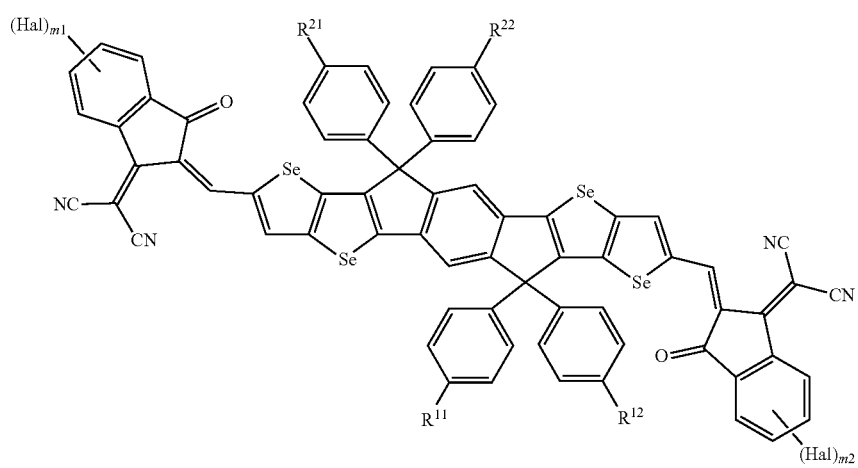

In Chemical Formulas 2B-2a and 2B-2b, $R^{11}$, $R^{12}$, $R^{21}$, and $R^{22}$ may each independently be hydrogen, deuterium, a halogen, a substituted or unsubstituted C1 to C20 (e.g., C4 to C10 or C6 to C8) alkyl group, or a substituted or unsubstituted C6 to C20 (e.g., C6 to C10 or C6 to C8) aryl group, Hal indicates a halogen (e.g., F, Cl, Br, or I), and m1 and m2 may be integers from 0 to 4 (e.g., 0 to 2).

The compound of Chemical Formula 2B-1a may be a compound of Chemical Formula 2B-1aa or 2B-1ab.

[Chemical Formula 2B-1aa]

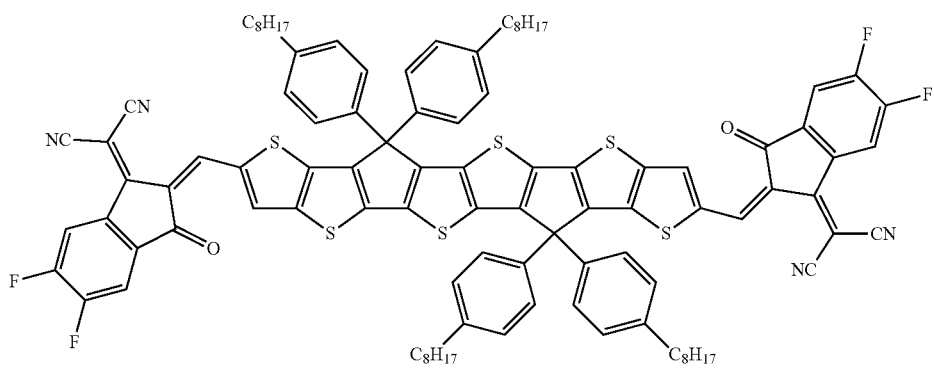

[Chemical Formula 2B-1ab]

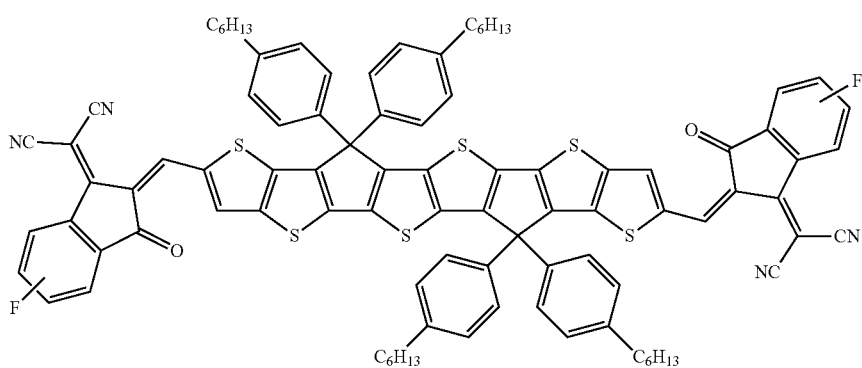

Substitution positions of F in Chemical Formula 2B-1ab may be symmetric or asymmetric.

The compound of Chemical Formula 2B-2a may be a compound of Chemical Formula 2B-2aa or 2B-2ab.

[Chemical Formula 2B-2aa]

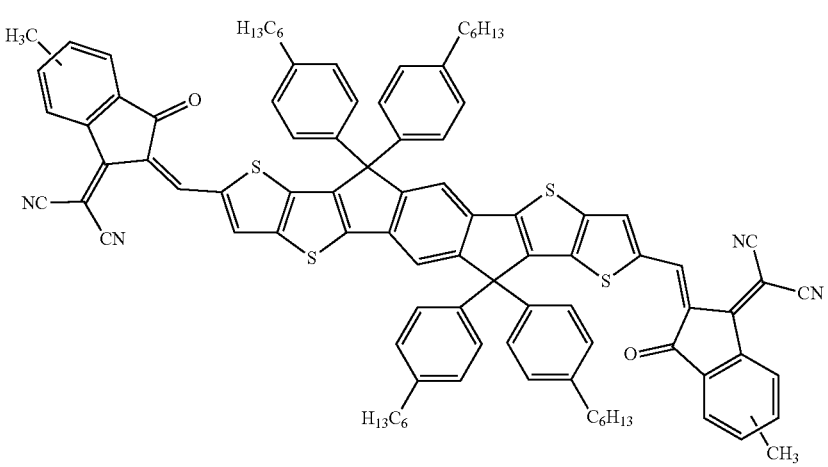

Substitution positions of $CH_3$ in Chemical Formula 2B-2aa may be symmetric or asymmetric.

[Chemical Formula 2B-2ab]

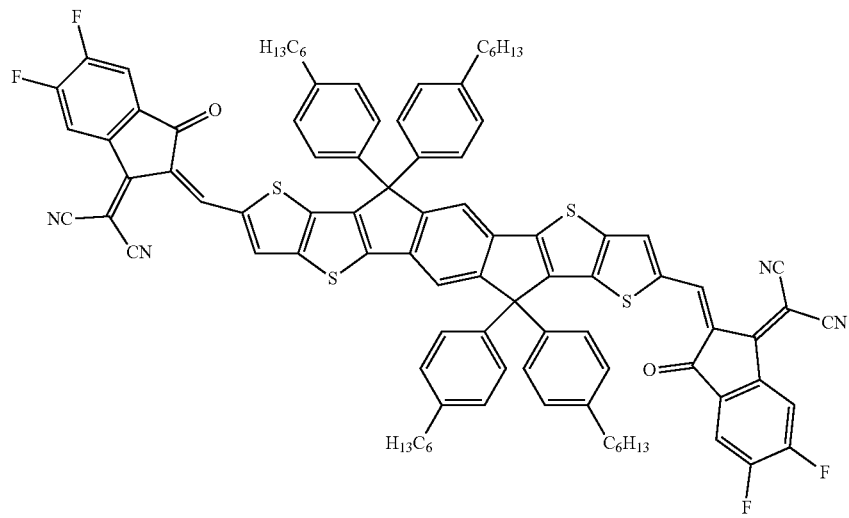

The compound represented by Chemical Formula 2C may be a compound of Chemical Formula 2C-1a or 2C-1 b.

[Chemical Formula 2C-1a]

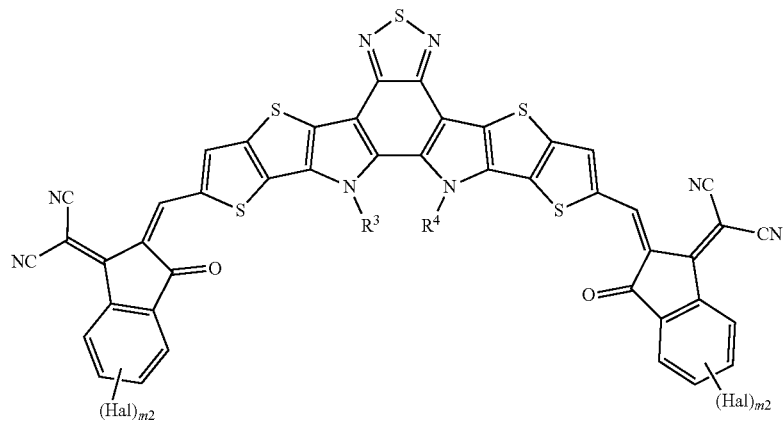

[Chemical Formula 2C-1b]

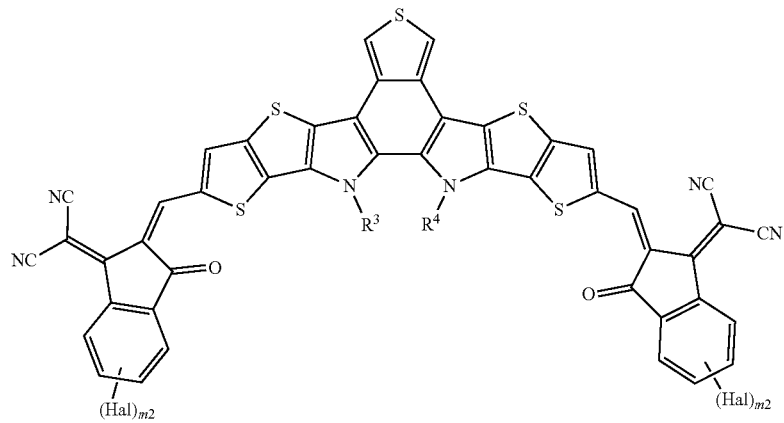

In Chemical Formulas 2C-1a and 2C-1 b,
Hal indicates a halogen (e.g., F, Cl, Br, or I),
m1 and m2 may be integers from 0 to 4 (e.g., 0 to 2), and
$R^3$ and $R^4$ may each independently be hydrogen, a C1 to C20 alkyl group, a C6 to C10 aryl group, or a C2 to C10 heteroaryl group.

The fullerene derivative refers to a compound having a substituent on the fullerene. The fullerene may be C60 to C540 fullerene, specifically C60, C70, C74, C76, C78, C80, C82, C84, C90, C96, C240, or C540, but is not limited thereto.

The substituent may be a substituted or unsubstituted alkyl group, a substituted or unsubstituted aryl group, a substituted or unsubstituted heterocyclic group, or a combination thereof. The alkyl group may be a C1 to C20 alkyl group, for example, a C1 to C10 alkyl group. The aryl group may be a C6 to C20 aryl group, for example, a C6 to C14 aryl group, and specifically, may be a phenyl group, a naphthyl group, or an anthracenyl group. The heterocyclic group may be a C2 to C20 heterocyclic group, for example a C2 to C14 heterocyclic group, and specifically, a furyl group, a thienyl group, a pyrrolyl group, an oxazolyl group, a pyridyl group, a quinolyl group, or a carbazolyl group. The substituted alkyl group, substituted aryl group, and substituted heterocyclic group may be an alkyl group, an aryl group, or a heterocyclic group substituted with a carboxyl group or an ester group.

Specific examples of the fullerene derivative may include [6,6]-phenyl-C61-butyric acid methyl ester (PC60BM), bis (1-[3-(methoxycarbonyl)propyl]-1-phenyl)-[6,6]C62 (bis-PCBM), phenyl-C70-butyric acid methyl ester (PC70BM), indene-C60 bisadduct (ICBA), or indene-C60 monoadduct (ICMA), but are not limited thereto.

The p-type semiconductor compound and the n-type semiconductor compound may be included in a volume ratio (p-type semiconductor compound:n-type semiconductor compound) of about 1:0.1 to about 1:10. That is, the volume ratio of the n-type semiconductor compound/p-type semiconductor compound may be greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, greater than or equal to about 0.9, greater than or equal to about 1, greater than about 1, or greater than or equal to about 1.1 and less than or equal to about 10, less than or equal to about 9, less than or equal to about 8, less than or equal to about 7, less than or equal to about 6, less than or equal to about 5, less than or equal to about 4, less than or equal to about 3, less than or equal to about 2, less than or equal to about 1.5, less than or equal to about 1.4, or less than or equal to about 1.3. Within the above range, it is possible to provide a BHJ structure having excellent infrared absorption properties.

The infrared absorption composition may absorb light in the infrared wavelength region, and the peak absorption wavelength (Amax) of the infrared absorption composition may be in a wavelength region of, for example greater than or equal to about 800 nm, greater than or equal to about 810 nm, greater than or equal to about 820 nm, greater than or equal to about 830 nm, greater than or equal to about 840 nm, greater than or equal to about 850 nm, greater than or equal to about 860 nm, greater than or equal to about 870 nm, greater than or equal to about 880 nm, greater than or equal to about 890 nm, or greater than or equal to about 900 nm. The peak absorption wavelength (Amax) of the infrared absorption composition may be in a wavelength region of, for example less than or equal to about 3000 nm, less than or equal to about 2900 nm, less than or equal to about 2800 nm, less than or equal to about 2700 nm, less than or equal to about 2600 nm, less than or equal to about 2500 nm, less than or equal to about 2400 nm, less than or equal to about 2300 nm, less than or equal to about 2200 nm, or less than or equal to about 2100 nm.

The infrared absorption composition has excellent photoelectric conversion efficiency of absorbing light and converting it into an electrical signal, and thus may be effectively used as a photoelectric conversion material of a photoelectric device.

Currently reported photoelectric devices exhibit a dark current of about $10^{-2}$ to $10^{-3}$ mA/cm$^2$ in the infrared wavelength region. However, the photoelectric device including the aforementioned infrared absorption composition may improve the sensitivity of the sensor including the photoelectric device by showing a dark current of about $10^{-4}$ mA/cm$^2$.

The p-type semiconductor compound and the n-type semiconductor compound may be solution-processed, so that a large-area photoelectric device may be produced at low cost.

The infrared absorption composition may be applied to various fields requiring absorption properties in an infrared wavelength region.

The infrared absorption composition simultaneously has light absorption properties and photoelectric properties in an infrared wavelength region, and may greatly reduce dark current of a photoelectric device, and thus may be effectively used as a photoelectric conversion material for a photoelectric device.

FIG. 1 is a cross-sectional view of a photoelectric device according to some embodiments.

Referring to FIG. 1, a photoelectric device 100 according to some embodiments includes a first electrode 10 and a second electrode 20 facing each other and a photoactive layer 30 between the first electrode 10 and the second electrode 20.

A substrate (not shown) may be disposed at the side of the first electrode 10 or the second electrode 20. The substrate may be for example made of (e.g., may at least partially comprise) an inorganic material such as glass; an organic material such as polycarbonate, polymethylmethacrylate, polyethyleneterephthalate, polyethylenenaphthalate, polyamide, polyethersulfone, or a combination thereof; or a silicon wafer. The substrate may be omitted.

One of the first electrode 10 or the second electrode 20 is an anode and the other is a cathode. For example, the first electrode 10 may be a cathode and the second electrode 20 may be an anode.

At least one of the first electrode 10 or the second electrode 20 may be a light-transmitting electrode and the light-transmitting electrode may be for example made of a conductive oxide such as an indium tin oxide (ITO), indium zinc oxide (IZO), zinc oxide (ZnO), tin oxide (SnO$_2$), aluminum tin oxide (AlTO), and/or fluorine doped tin oxide (FTO), or a metal thin layer of a single layer or a multilayer. When one of the first electrode 10 and the second electrode 20 is a non-light-transmitting electrode, it may be made of, for example, an opaque conductor such as aluminum (Al), silver (Ag), or gold (Au). For example, the first electrode 10 and the second electrode 20 may be all light-transmitting electrodes. For example, the second electrode 20 may be a light receiving electrode disposed at a light receiving side.

The photoactive layer 30 includes an infrared absorption composition including the aforementioned p-type semiconductor compound and n-type semiconductor compound.

The photoactive layer 30 is a layer (intrinsic layer, I layer) in which the p-type semiconductor compound and the n-type semiconductor compound form a pn junction and may produce excitons by receiving light from outside (e.g., an exterior of the photoactive layer 30) and then separating holes and electrons from the produced excitons.

The photoactive layer 30 may further include a p-type layer and/or an n-type layer in addition to the intrinsic layer. The p-type layer may include a p-type semiconductor compound and the n-type layer may include an n-type semiconductor compound. For example, they may be included in various combinations of p-type layer/I layer, I layer/n-type layer, p-type layer/I layer/n-type layer, and the like.

The photoelectric device 100 may further include an auxiliary layer between the first electrode 10 and the photoactive layer 30 and/or the second electrode 20 and the photoactive layer 30. The auxiliary layer may be a charge auxiliary layer or an optical auxiliary layer.

Figure 2:
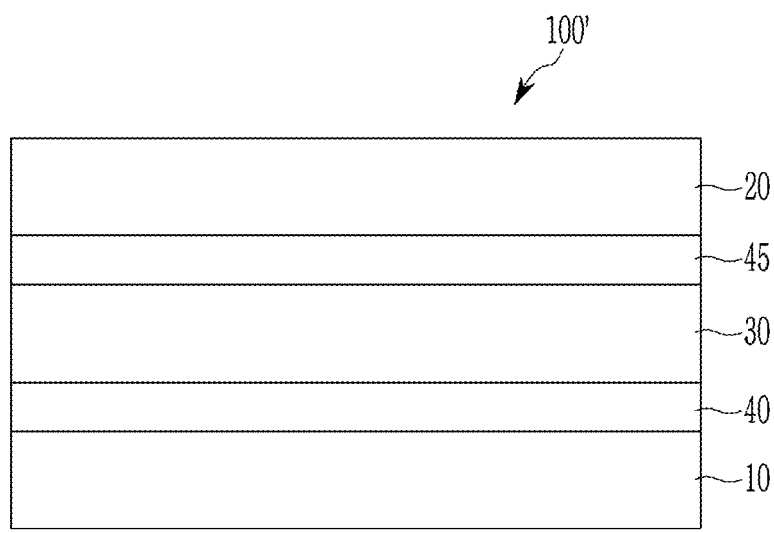
FIG. 2 is a cross-sectional view showing a photoelectric device according to some embodiments.

This photoelectric device is shown in FIG. 2. FIG. 2 is a cross-sectional view showing a photoelectric device according to some embodiments.

Referring to FIG. 2, the photoelectric device 100' according to the present embodiment includes a first electrode 10 and a second electrode 20 facing each other, and a photoactive layer 30 between the first electrode 10 and the second electrode 20, like the above embodiment.

However, unlike the above embodiment, the photoelectric device 100' according to the present embodiment further includes charge auxiliary layers 40 and 45 between the first electrode 10 and the photoactive layer 30, and between the second electrode 20 and the photoactive layer 30, respectively. The charge auxiliary layers 40 and 45 facilitate the movement of holes and electrons separated from the photoactive layer 30 to increase efficiency.

The charge auxiliary layers 40 and 45 may include at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 40 and/or 45 may include for example an organic material, an inorganic material, or an organic-inorganic material. The organic material may be an organic material having hole or electron characteristics and the inorganic material may be for example a metal oxide such as a molybdenum oxide, a tungsten oxide, or a nickel oxide.

The charge auxiliary layers 40 and 45 may include for example the aforementioned infrared absorption composition.

The optical auxiliary layer may be disposed in the light incident direction of the photoelectric device. For example, when the second electrode 20 is a light receiving electrode, the optical auxiliary layer may be disposed on the photoactive layer 30. For example, the optical auxiliary layer may be disposed between the second electrode 20 and the photoactive layer 30.

The photoelectric devices 100 and 100' may further include an anti-reflection layer (not shown) on one surface of the first electrode 10 or the second electrode 20.

The anti-reflection layer is disposed at a light incidence side and lowers reflectance of light of incident light and thereby light absorbance is further improved. For example, when light enters from the first electrode 10, the anti-reflection layer may be disposed on the first electrode 10 while when light enters from the second electrode 20, the anti-reflection layer may be disposed under the second electrode 20.

The anti-reflection layer may include, for example a material having a refractive index of about 1.6 to about 2.5 and may include for example at least one of a metal oxide, a semi-metal oxide, a metal sulfide, and an organic material having a refractive index within the ranges. The anti-reflection layer may include, for example a metal oxide or a semi-metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as a zinc sulfide; or an organic material such as an amine derivative, but is not limited thereto.

In the photoelectric devices 100 and 100', when light enters from the first electrode 10 or the second electrode 20 and the photoactive layer 30 absorbs light in a desired and/or alternatively predetermined wavelength region, excitons may be generated thereinside. The excitons are separated into holes and electrons in the photoactive layer 30, and the separated holes are transported to an anode that is one of the first electrode 10 and the second electrode 20 and the separated electrons are transported to the cathode that is the other of the first electrode 10 and the second electrode 20 so as to flow a current.

The photoelectric devices 100 and 100' may be applied to a sensor such as an image sensor (CMOS image sensor), a photodetector, an optical sensor (infrared light sensor), a solar cell, etc., but are not limited thereto.

Figure 3:
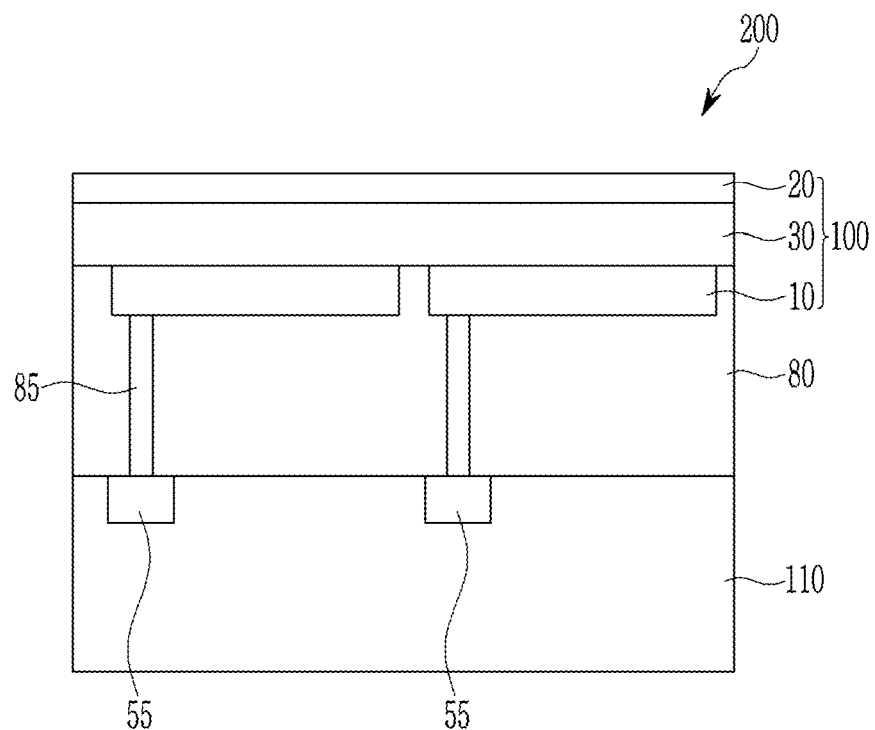
FIG. 3 is a cross-sectional view showing an image sensor according to an embodiment.

FIG. 3 is a cross-sectional view showing an image sensor according to some embodiments.

The image sensor 200 according to an embodiment includes a semiconductor substrate 110, an insulating layer 80, and a photoelectric device 100.

FIG. 3 illustrates an image sensor 200 including the photoelectric device 100 of FIG. 1, but the image sensor 200 may also include the photoelectric device 100' of FIG. 2.

The semiconductor substrate 110 may be a silicon substrate and is integrated with a transmission transistor (not shown) and a charge storage 55. The charge storage 55 may be integrated in each pixel. The charge storage 55 is electrically connected to the photoelectric device 100 and information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the semiconductor substrate 110.

The insulation layer 80 is formed on the metal wire and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The aforementioned photoelectric device 100 is formed on the insulation layer 80. As described above, the photoelectric device 100 includes a first electrode 10, a photoactive layer 30, and a second electrode 20. Even though a structure in which the first electrode 10, the photoactive layer 30, and the second electrode 20 are sequentially stacked is shown as an example in the drawing, the present disclosure is not limited to this structure, and the second electrode 20, the photoactive layer 30, and the first electrode 10 may be arranged in this order.

The first electrode 10 and the second electrode 20 may both be transparent electrodes, and the photoactive layer 30 is the same as described above. The photoactive layer 30 may selectively absorb light in an infrared wavelength region. Incident light from the side of the second electrode 20 may be photoelectrically converted by mainly absorbing light in an infrared wavelength region in the photoactive layer 30.

Focusing lens (not shown) may be further formed on the photoelectric device 100. The focusing lens may control a direction of incident light and gather the light in one region. The focusing lens may have a shape of, for example, a cylinder or a hemisphere, but is not limited thereto.

Figure 4:
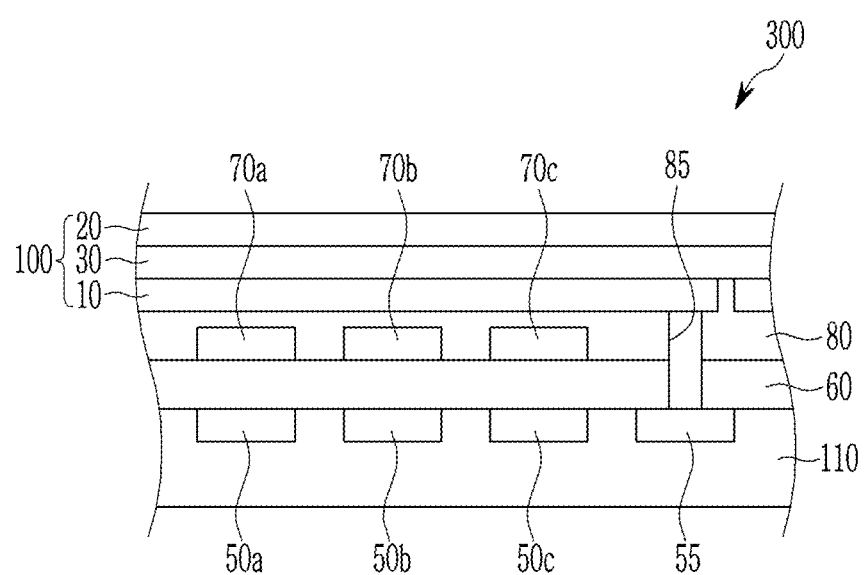
FIG. 4 is a cross-sectional view showing an image sensor according to another embodiment.

FIG. 4 is a cross-sectional view showing an image sensor according to some embodiments.

Referring to FIG. 4, an image sensor 300 according to an embodiment includes a semiconductor substrate 110 integrated with photo-sensing devices 50*a*, 50*b*, and 50*c*, a transmission transistor (not shown), and a charge storage 55, a lower insulation layer 60, color filters 70*a*, 70*b*, and 70*c*, an upper insulation layer 80, and a photoelectric device 100. FIG. 4 illustrates an image sensor 300 including the photoelectric device 100 of FIG. 1, but the image sensor 300 may also include the photoelectric device 100' of FIG. 2.

The semiconductor substrate 110 may be integrated with photo-sensing devices 50*a*, 50*b*, and 50*c*, a transmission transistor (not shown), and a charge storage 55. The photo-sensing devices 50*a*, 50*b*, and 50*c* may be photodiodes.

The photo-sensing devices 50*a*, 50*b*, and 50*c*, the transmission transistor, and/or the charge storage 55 may be integrated in each pixel. For example, the photo-sensing device 50*a* may be included in a red pixel, the photo-sensing device 50*b* may be included in a green pixel, and the photo-sensing device 50*c* may be included in a blue pixel.

The photo-sensing devices 50*a*, 50*b*, and 50*c* sense light, the information sensed by the photo-sensing devices may be transferred by the transmission transistor, the charge storage 55 is electrically connected to the photoelectric device 100, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing devices 50*a* and 50*b*.

The lower insulation layer 60 is formed on the metal wire and the pad.

Color filters 70*a*, 70*b*, and 70*c* are formed on the lower insulation layer 60. The color filters 70*a*, 70*b*, and 70*c* includes a red filter 70*a* formed in a red pixel, a green filter 70 formed in a green pixel, and a blue filter 70*c* formed in a blue pixel.

The upper insulation layer 80 is formed on the color filters 70*a*, 70*b*, and 70*c*. The upper insulation layer 80 eliminates steps caused by the color filters 70*a*, 70*b*, and 70*c* and planarizes the surface.

The aforementioned photoelectric device 100 is formed on the upper insulation layer 80. As described above, the photoelectric device 100 includes a first electrode 10, a photoactive layer 30, and a second electrode 20. Even though a structure in which the first electrode 10, the photoactive layer 30, and the second electrode 20 are sequentially stacked is shown as an example in the drawing, the present disclosure is not limited to this structure, and the second electrode 20, the photoactive layer 30, and the first electrode 10 may be arranged in this order.

The first electrode 10 and the second electrode 20 may both be transparent electrodes, and the photoactive layer 30 is the same as described above. The photoactive layer 30 may selectively absorb light in a near-infrared wavelength region.

Incident light from the side of the second electrode 20 may be photoelectrically converted by mainly absorbing light in a near infra-red wavelength region in the photoactive layer 30. Light in the remaining wavelength region may pass through the first electrode 10 and the color filters 70*a*, 70*b*, and 70*c*, the light in a red wavelength region passing through the color filter 70*a* may be sensed by the photo-sensing device 50*a*, the light in a green wavelength region passing through the color filter 70*b* may be sensed by the photo-sensing device 50*b*, and the light in a blue wavelength region passing through the color filter 70*c* may be sensed by the photo-sensing device 50*c*.

Figure 5:
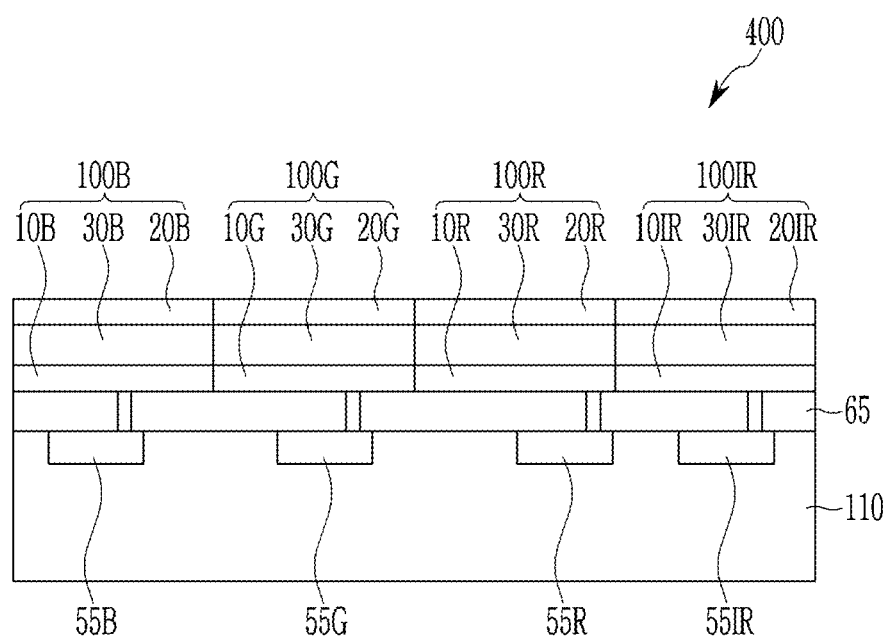
FIG. 5 is a cross-sectional view showing an image sensor according to another embodiment.

FIG. 5 is a cross-sectional view showing an image sensor according to some embodiments.

Referring to FIG. 5, an image sensor 400 according to an embodiment includes a semiconductor substrate 110 integrated with an infrared light charge storage 55IR, a blue light charge storage 55B, a green light charge storage 55G, a red light charge storage 55R, and a transmission transistor (not shown), a lower insulation layer 65, a blue photo-sensing device 100B, a green photo-sensing device 100G, a red photo-sensing device 100R, and an infrared photo-sensing device 100IR.

The semiconductor substrate 110 may be a silicon substrate, and the infrared light charge store 55IR, blue light charge store 55B, the green photo charge store 55G, the red photo charge store 55R, and the transfer transistor (not shown) are integrated therein. The blue light charge storage 55B, the green light charge storage 55G, and the red light charge storage 55R may be integrated for each blue pixel, green pixel, and red pixel.

Charges generated in the infrared photo-sensing device 100IR, the blue photo-sensing device 100B, the green photo-sensing device 100G, and the red photo-sensing device 100R are collected in the infrared light charge storage 55IR, the blue light charge storage 55B, the green light charge storage 55G, and the red light charge storage 55R, which are electrically connected to each of the infrared photo-sensing device 100IR, the blue photo-sensing device 100B, the green photo-sensing device 100G, and the red photo-sensing device 100R.

A metal wire (not shown) and a pad (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto.

The lower insulation layer 65 may be formed on the metal wires and pads. The lower insulation layer 65 may be made of an inorganic insulation material such as a silicon oxide and/or a silicon nitride, or a low dielectric constant (low K) material such as SiC, SiCOH, SiCO, and SiOF.

The blue photo-sensing device 100B, the green photo-sensing device 100G, the red photo-sensing device 100R, and the red photo-sensing device 100IR are formed on the lower insulation layer 65. The blue photo-sensing device 100B may include a first electrode 10B, a second electrode 20B, and a photoactive layer 30B configured to selectively absorb light in a blue wavelength region. The green photo-sensing device 100G may include a first electrode 10G, a second electrode 20G, and a photoactive layer 30G configured to selectively absorb light in a green wavelength region. The red photo-sensing device 100R may include a first electrode 10R, a second electrode 20R, and a photoactive layer 30R configured to selectively absorb light in a red wavelength region. The infrared photo-sensing device 100IR may include a first electrode 10IR, a second electrode 20IR, and a photoactive layer 30IR configured to selectively absorb light in an infrared light wavelength region.

The first electrodes 10B, 10G, 10R, and 10IR and the second electrodes 20B, 20G, 20R, and 20IR may be light-transmitting electrodes and may be made of, for example, a transparent conductor such as indium tin oxide (ITO), indium zinc oxide (IZO), zinc oxide (ZnO), tin oxide ($SnO_2$), aluminum tin oxide (AlTO), and fluorine-doped tin oxide (FTO), or may be a metal thin film having a thin thickness of several nanometers or several tens of nanometers or a metal thin film having a thin thickness of several nanometers to several tens of nanometers doped with a metal oxide.

The photoactive layers 30B, 30G, 30R, and 30IR may include a p-type semiconductor material and an n-type semiconductor material. The photoactive layer 30B of the blue photo-sensing device 100B may include a p-type semiconductor material configured to selectively absorb light in a blue wavelength region and an n-type semiconductor material configured to selectively absorb light in a blue wavelength region, the photoactive layer 30G of the green photo-sensing device 100G may include a p-type semiconductor material configured to selectively absorb light in a green wavelength region and an n-type semiconductor material configured to selectively absorb light in a green wavelength region, the photoactive layer 30R of the red photo-sensing device 100R may include a p-type semiconductor material configured to selectively absorb light in a red wavelength region and an n-type semiconductor material configured to selectively absorb light in a red wavelength region, and the photoactive layer 30IR of the infrared photo-sensing device 100IR may include the aforementioned infrared absorption composition. The infrared photo-sensing device 100IR may selectively absorb light in an infrared region of greater than or equal to about 800 nm and less than or equal to about 3000 nm without absorption of the visible light region.

Figure 6:
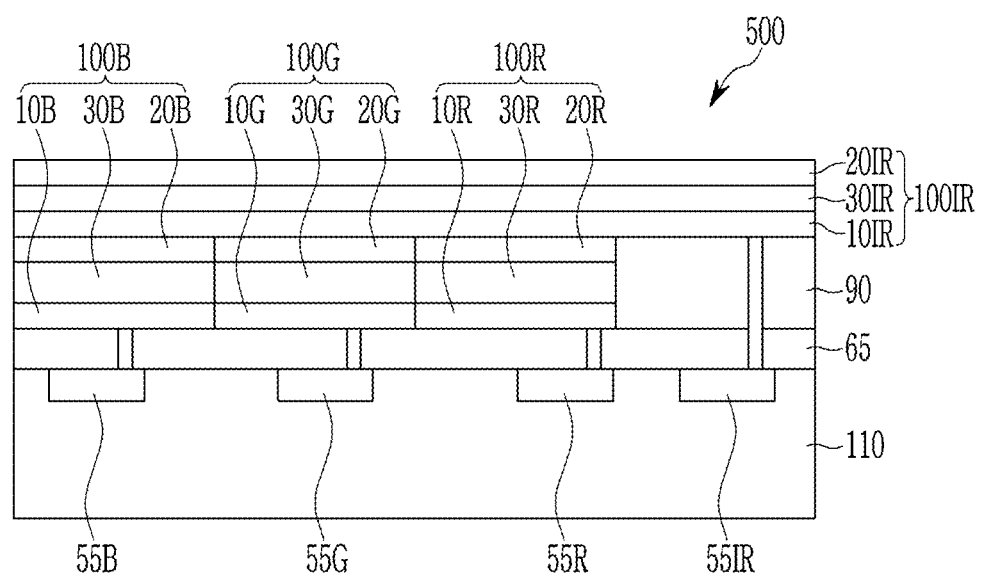
FIG. 6 is a cross-sectional view showing an image sensor according to another embodiment.

FIG. 6 is a cross-sectional view showing an image sensor according to some embodiments.

Referring to FIG. 6, an image sensor 500 may include an semiconductor substrate 110 integrated with an infrared light charge storage 55IR, a blue light charge storage 55B, a green light charge storage 55G, a red light charge storage 55R, and a transmission transistor (not shown), a lower insulation layer 65, a blue photo-sensing device 100B, a green photo-sensing device 100G, a red photo-sensing device 100R, and an infrared photo-sensing device 100IR. The infrared photo-sensing device 100IR is formed on is formed on the whole front surface of the blue photo-sensing device 100B, the green photo-sensing device 100G, and the red photo-sensing device 100R. The rest of the configuration is the same as that of the image sensor shown in FIG. 5, except the infrared photo-sensing device 100IR also extends on the upper insulation layer 90.

Figure 7:
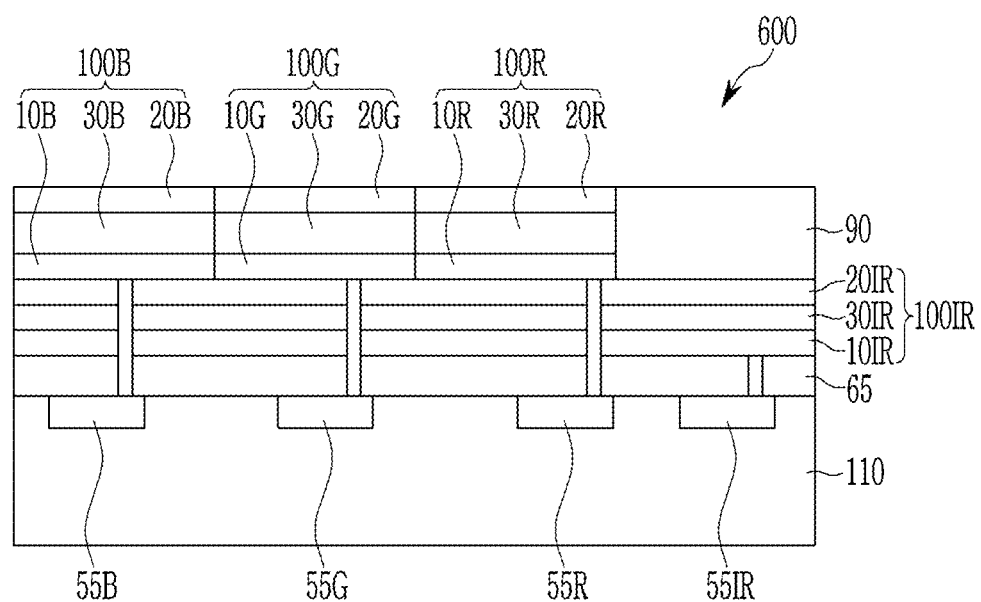
FIG. 7 is a cross-sectional view showing an image sensor according to another embodiment.

In the configuration of FIG. 6, the infrared photo-sensing device 100IR may be present on the lower insulating layer 65, the blue photo-sensing device 100B, the green photo-sensing device 100G, and the red photo-sensing device 100R may be disposed thereon, and the upper insulation layer 90 may be provided on a portion of the infrared photo-sensing device 100IR over the infrared light charge storage 55IR. An image sensor 600 having such a configuration is shown in FIG. 7.

The infrared photo-sensing device 100IR may be configured to selectively absorb light in an infrared region of greater than or equal to about 800 nm and less than or equal to about 3000 nm, and have a large absorption area to improve efficiency.

The sensor according to the present embodiment may include a plurality of sensors having different functions. For example, at least one of the plurality of sensors having different functions may be a biometric sensor, and the biometric sensor may be for example an iris sensor, a depth sensor, a fingerprint sensor, a blood vessel distribution sensor, and the like, but is not limited thereto.

For example, one of the plurality of sensors having different functions may be an iris sensor and the other may be a depth sensor. The iris sensor identifies a person by using unique iris characteristics of every person and specifically, taking an image of an eye of a user within an appropriate distance, processing the image, and comparing it with his/her stored image. The depth sensor identifies a shape and a location of an object from its three-dimensional information by taking an image of the object within an appropriate distance with a user and processing the image. This depth sensor may be for example used as a face recognition sensor.

In an embodiment, a plurality of sensors may include, for example a first infrared light sensor configured to sense light in an infrared region having a first wavelength ($\lambda_1$) in an infrared wavelength region and a second infrared light sensor configured to sense light in an infrared region having a second wavelength ($\lambda_2$) in an infrared wavelength region.

The first wavelength ($\lambda_1$) and the second wavelength ($\lambda_2$) may be for example different in a wavelength region of about 800 nm to about 3000 nm, and for example a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

For example, one of the first wavelength ($\lambda_1$) and the second wavelength ($\lambda_2$) may belong to a wavelength region of about 780 nm to about 900 nm and the other of the first wavelength ($\lambda_1$) and the second wavelength ($\lambda_2$) may belong to a wavelength region of about 830 nm to about 1000 nm.

For example, one of the first wavelength ($\lambda_1$) and the second wavelength ($\lambda_2$) may belong to a wavelength region of about 780 nm to about 840 nm and the other of the first wavelength ($\lambda_1$) and the second wavelength ($\lambda_2$) may belong to a wavelength region of about 910 nm to about 970 nm.

For example, one of the first wavelength ($\lambda_1$) and the second wavelength ($\lambda_2$) may belong to a wavelength region of about 800 nm to about 830 nm and the other of the first wavelength ($\lambda_1$) and the second wavelength ($\lambda_2$) may belong to a wavelength region of about 930 nm to about 950 nm.

For example, one of the first wavelength ($\lambda_1$) and the second wavelength ($\lambda_2$) may belong to a wavelength region of about 805 nm to about 815 nm and the other of the first wavelength ($\lambda_1$) and the second wavelength ($\lambda_2$) may belong to a wavelength region of about 935 nm to about 945 nm.

For example, one of the first wavelength ($\lambda_1$) and the second wavelength ($\lambda_2$) may about 810 nm and the other of the first wavelength ($\lambda_1$) and the second wavelength ($\lambda_2$) may be about 940 nm.

Figure 8:
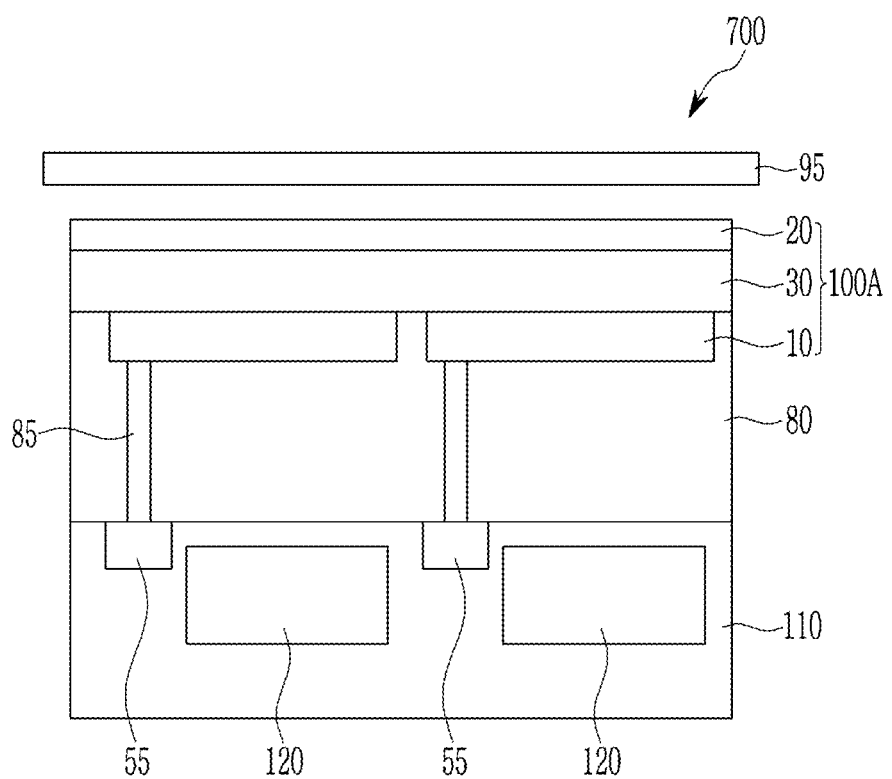
FIG. 8 is a cross-sectional view showing an image sensor according to another embodiment.

FIG. 8 is a cross-sectional view illustrating an image sensor including a plurality of sensors according to some embodiments.

The image sensor 700 according to the present embodiment includes a dual bandpass filter 95, a first infrared light sensor 100A, an insulating layer 80, and a semiconductor substrate 110 integrated with a second infrared light sensor 120. The first infrared light sensor 100A and the second infrared light sensor 120 are stacked.

The dual bandpass filter 95 may be disposed on a front side of the first infrared light sensor 100A and may selectively transmit infrared light including the first wavelength ($\lambda_1$) and infrared light including the second wavelength ($\lambda_2$) and may block and/or absorb other light. Herein, other light may include light in an ultraviolet (UV) and visible region.

The first infrared light sensor 100A includes a first electrode 10, a photoactive layer 30, and a second electrode 20. The first infrared light sensor 100A may be the same as the photoelectric device 100 according to the aforementioned embodiment.

The second infrared light sensor 120 may be integrated in the semiconductor substrate 110 and may be a photo-sensing device. The semiconductor substrate 110 may be for example a silicon substrate and may be integrated with the second infrared light sensor 120, the charge storage 55, and a transmission transistor (not shown).

The second infrared light sensor 120 may be a photodiode and may sense entered light, and sensed information is transferred by the transmission transistor. Herein, the light entered into the second infrared light sensor 120 is light that passes the dual bandpass filter 95 and the first infrared light sensor 100A and may be infrared light in a desired and/or alternatively predetermined region including the second wavelength ($\lambda_2$). All infrared light in a desired and/or alternatively predetermined region including the first wavelength ($\lambda_1$) may be absorbed by the photoactive layer 30 and may not reach the second infrared light sensor 120. In this case, a separate filter for wavelength selectivity with respect to the light entered into the second infrared light sensor 120 is not separately needed. However, for the time when all infrared light in a desired and/or alternatively predetermined region including the first wavelength ($\lambda_1$) is not absorbed by the photoactive layer 30, a filter between the first infrared light sensor 100A and the second infrared light sensor 120 may be further disposed.

The sensor according to the present embodiment may include two infrared light sensors respectively performing separately functions and thus may work as a combination sensor. In addition, two sensors performing separately functions are stacked in each pixel, and thus the number of pixel performing functioning of each sensor is twice increased while maintaining a size and resultantly, sensitivity may be much improved.

The aforementioned sensor may be applied to various electronic devices, for example and the electronic devices may include for example a camera, a camcorder, a mobile phone internally having them, a display device, a security device, or a medical device, but are not limited thereto. Although not illustrated, the photo-sensing devices and/or light sensors in the image sensors of FIGS. 3 to 8 may be modified to further include charge auxiliary layers 40 and 45 like the photoelectric device 100' in FIG. 2

Figure 9:
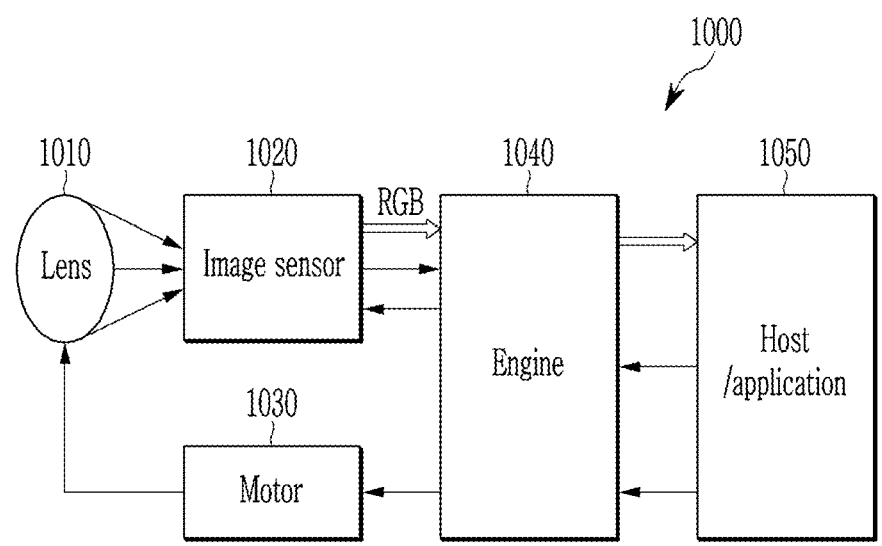
FIG. 9 is a block diagram of a digital camera including an image sensor according to an embodiment.

FIG. 9 is a block diagram of a digital camera including an image sensor according to an embodiment.

Referring to FIG. 9, a digital camera 1000 includes a lens 1010, an image sensor 1020, a motor 1030, and an engine 1040. The image sensor 1020 may be one of image sensors according to embodiments shown in FIGS. 3 to 8.

The lens 1010 concentrates incident light on the image sensor 1020. The image sensor 1020 generates RGB data for received light through the lens 1010.

In an embodiment, the image sensor 1020 may interface with the engine 1040.

The motor 1030 may adjust the focus of the lens 1010 or perform shuttering in response to a control signal received from the engine 1040. The engine 1040 may control the image sensor 1020 and the motor 1030.

The engine 1040 may be connected to a host/application 1050.

Figure 10:
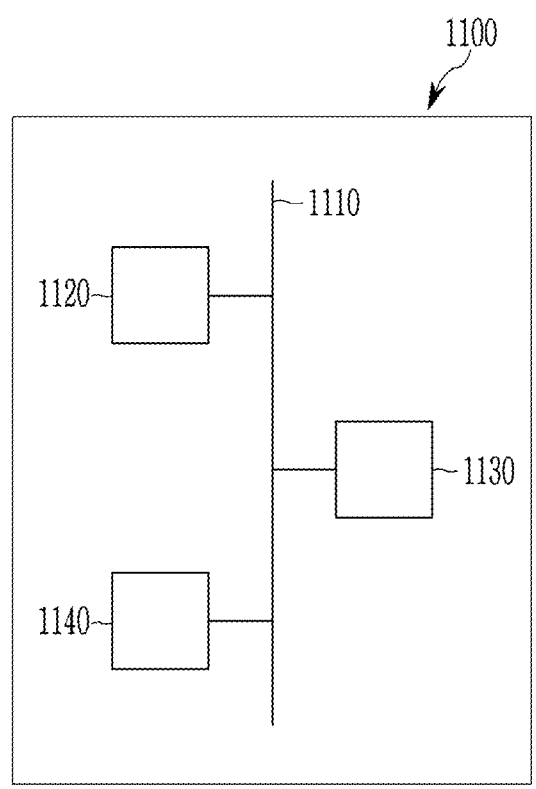
FIG. 10 is a block diagram of an electronic device according to an embodiment.

FIG. 10 is a block diagram of an electronic device according to an embodiment.

Referring to FIG. 10, an electronic device 1100 may include a processor 1120, a memory 1130, and an image sensor 1140 that are electrically coupled together via a bus 1110. The image sensor 1140 may be an image sensor according to one of the aforementioned embodiments. The memory 1130, which may be a non-transitory computer readable medium, may store a program of instructions and/or other information. The memory 1130 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1120 may execute the stored program of instructions to perform one or more functions. For example, the processor 1120 may be configured to process electrical signals generated by the image sensor 1140. The processor 1120 may be configured to generate an output (e.g., an image to be displayed on a display interface) based on such processing.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Hereinafter, embodiments are illustrated in more detail with reference to examples. However, these examples are non-limiting, and inventive concepts are not limited thereto.

Production of Photoelectric Device

Example 1

ITO is sputtered on a glass substrate to form an about 150 nm-thick anode, and PEDOT (poly(3,4-ethylenedioxythiophene)) is deposited to form a 45 nm-thick hole transport layer (HTL). Subsequently, on the hole transport layer (HTL), a solution prepared by dispersing a compound represented by Chemical Formula 1A-1a (a p-type semiconductor compound, octabutoxy tin naphthalocyanine dichloride) and PC60BM ([6,6]-phenyl-C61-butyric acid methyl ester, an n-type semiconductor compound) in a chlorobenzene solvent is spin-coated to form an 150 nm-thick photoactive layer. Herein, the p-type semiconductor compound and the n-type semiconductor compound are used in a volume ratio (p:n) of 1:3. On the photoactive layer, C60 is deposited to form a 30 nm-thick auxiliary layer. On the auxiliary layer, Ag is deposited to from a 20 nm-thick cathode. Subsequently, on the cathode, a glass plate is used for sealing to produce a photoelectric device.

[Chemical Formula 1A-1a]

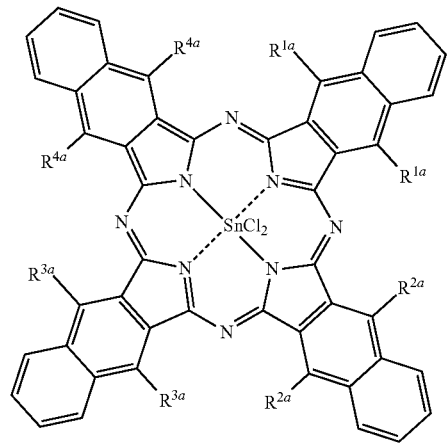

In Chemical Formula 1A-1a,
two $R^{1a}$'s, two $R^{2a}$'s, two $R^{3a}$'s, and two $R^{4a}$'s are $O(CH_2)_3CH_3$.

Example 2

On a glass substrate, ITO is sputtered to from an about 150 nm-thick anode, and molybdenum oxide ($MoO_x$, $0<x\leq3$) is deposited thereon to form a 20 nm-thick charge auxiliary layer. On the charge auxiliary layer, a solution obtained by dispersing a compound represented by Chemical Formula 1A-1a (a p-type semiconductor compound) and a compound represented by Chemical Formula 2B-1aa (an n-type semiconductor compound) in a chlorobenzene solvent is spin-coated to form an 150 nm-thick photoactive layer. Herein, the p-type semiconductor compound and the n-type semiconductor compound are used in a volume ratio (p:n) of 1:1.2. On the photoactive layer, C60 is deposited to form a 30 nm-thick auxiliary layer. On the auxiliary layer, ITO is deposited to form a 7 nm-thick cathode. Subsequently, a glass plate is used for sealing to produce a photoelectric device.

[Chemical Formula 2B-1aa]

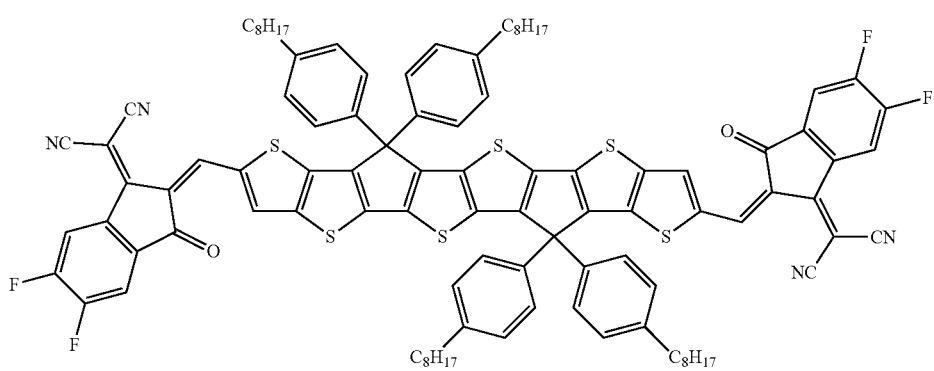

Example 3

A photoelectric device is produced according to the same method as Example 2 except that a compound represented by Chemical Formula 2B-1ab is used instead of the compound represented by Chemical Formula 2B-1aa.

[Chemical Formula 2B-1ab]

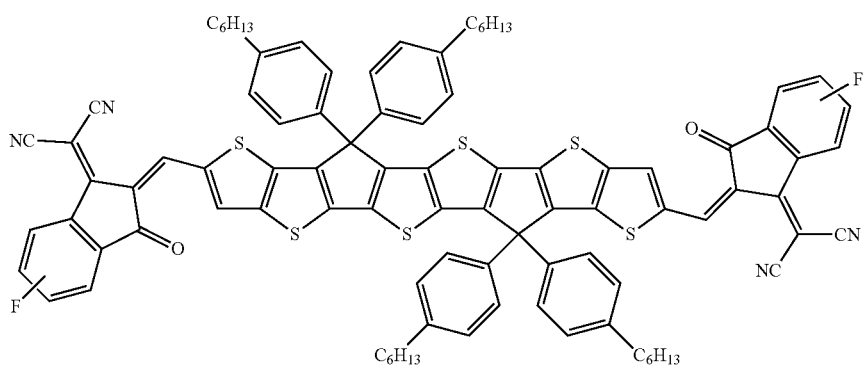

The compound represented by Chemical Formula 2B-1ab is a mixture of a compound having a symmetric substitution position of F and a compound having an asymmetric substitution position of F (FOIC of 1-Material Inc.).

Example 4

A photoelectric device is produced according to the same method as Example 2 except that PC70BM is used instead of the compound represented by Chemical Formula 2B-1aa.

Comparative Example 1

On a glass substrate, ITO is sputtered to form an 150 nm-thick anode, and PEDOT (poly(3,4-ethylenedioxythiophene)) is deposited to form a 45 nm-thick hole transport layer (HTL). Subsequently, on the hole transport layer (HTL), a solution prepared by dispersing the compound represented by Chemical Formula 1A-1a (a p-type semiconductor compound) in a chlorobenzene solvent is spin-coated to form a 25 nm-thick p-type layer, and C60 is deposited to form a 30 nm-thick N-type layer. On the n-type layer, Ag is deposited to from a 20 nm-thick cathode. Subsequently, on the cathode, a glass plate is used for sealing to produce a photoelectric device.

Evaluation of External Quantum Efficiency and Dark Current

The photoelectric devices according to Example 1 and Comparative Example 1 are evaluated with respect to external quantum efficiency, and the results are shown in Table 1. The external quantum efficiency (EQE) is evaluated at 3 V at a wavelength of 400 nm to 1500 nm in an Incident Photon to Current Efficiency (IPCE) method. Herein, equipment calibration is performed according to Si and Ge photodiode references.

TABLE 1

|  | EQE (%) |
| --- | --- |
| Example 1 | 46.8 |
| Comparative Example 1 | 2.2 |

Referring to Table 1, the photoelectric device according to Example 1 exhibits 20 times or more increased EQE than the photoelectric device according to Comparative Example 1. The photoelectric devices according to Examples 2 to 4 are evaluated with respect to a dark current (DC), and the results are shown in Table 2. In addition, after annealing the photoelectric devices according to Examples 2 to 4 at 140° C., a dark current is evaluated, and the results are shown in Table 2. The dark current is evaluated by using a value at 3 V after obtaining a current density-voltage (J-V) curve from −5 V to 5 V with an equipment made by Keithley Instruments.

TABLE 2

|  | Dark current (h/s/μm$^2$) | Dark current after annealing at 140° C. (h/s/μm$^2$) |
| --- | --- | --- |
| Example 2 | 1.1 × 10$^4$ | 8.5 × 10$^3$ |
| Example 3 | 6.0 × 10$^3$ | 4.6 × 10$^3$ |
| Example 4 | 1.7 × 10$^5$ | 7.4 × 10$^4$ |

Referring to Table 2, the photoelectric devices according to Examples 2 to 4 exhibit improved current characteristics and excellent dark current characteristics even after the annealing.

While some example embodiments have been described, it is to be understood that inventive concepts are not limited to the disclosed embodiments. On the contrary, inventive concepts are intended to cover various modifications and equivalent arrangements included within the spirit and scope of the appended claims.

What is claimed is:

1. An infrared absorption composition, comprising
a p-type semiconductor compound represented by Chemical Formula 1, and
an n-type semiconductor compound including a compound represented by Chemical Formula 2A, a compound represented by Chemical Formula 2B, a compound represented by Chemical Formula 2C, a fullerene derivative, or a combination thereof,
wherein the p-type semiconductor compound and the n-type semiconductor compound provide a bulk heterojunction (BHJ) structure,

[Chemical Formula 1]

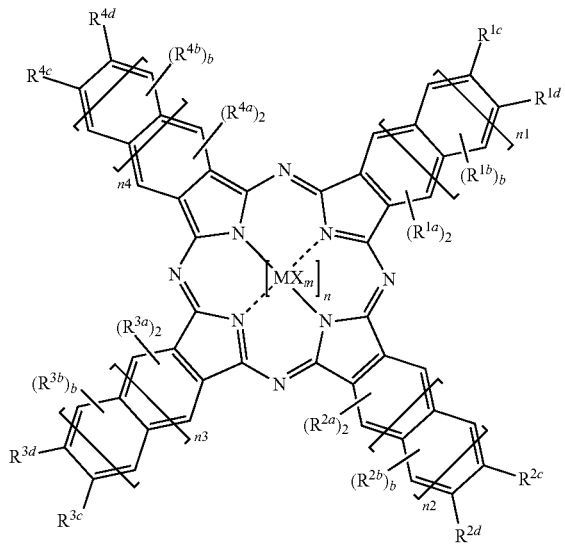

wherein, in Chemical Formula 1,
M is Sn, Ni, V, Al, Zn, Si, Co, or Ge,
X is a halogen,
m is an integer from 0 to 4,
n is 0 or 1,
two $R^{1a}$'s, two $R^{2a}$'s, two $R^{3a}$'s, and two $R^{4a}$'s are each independently hydrogen, deuterium, a halogen, a cyano group, a C1 to C20 haloalkyl group, a C1 to C20 cyanoalkyl group, a C1 to C20 alkyl group, or a C1 to C20 alkoxy group, provided that at least one of two $R^{1a}$'s, at least one of two $R^{2a}$'s, at least one of two $R^{3a}$'s, and at least one of two $R^{4a}$'s are a C1 to C20 alkyl group or a C1 to C20 alkoxy group,
$R^{1b}$, $R^{1c}$, $R^{1d}$, $R^{2b}$, $R^{2c}$, $R^{2d}$, $R^{3b}$, $R^{3c}$, $R^{3d}$, $R^{4b}$, $R^{4c}$ and $R^{4d}$ are each independently hydrogen, deuterium, a halogen, a C1 to C20 haloalkyl group, a cyano group, a C1 to C20 cyanoalkyl group, a C1 to C20 alkyl group, or a C1 to C20 alkoxy group,
b is an integer of 0 to 2, and
n1, n2, n3, and n4 are each independently an integer from 1 to 4,

[Chemical Formula 2A]

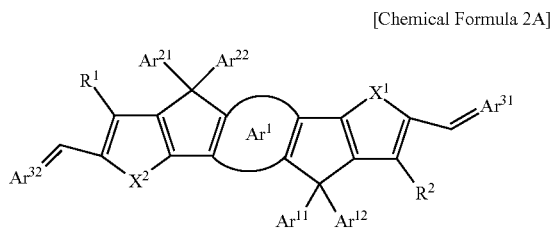

wherein, in Chemical Formula 2A,
$Ar^1$ is one of the moieties represented by Chemical Formula 3,
$X^1$ and $X^2$ are each independently S, Se, or Te,
$Ar^{11}$, $Ar^{12}$, $Ar^{21}$, and $Ar^{22}$ are each independently a substituted or unsubstituted C6 to C10 aryl group or a substituted or unsubstituted C3 to C10 heteroaryl group,
$Ar^{31}$ and $Ar^{32}$ are each independently a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and
$R^1$ and $R^2$ are each independently hydrogen or a C1 to C10 alkyl group,

[Chemical Formula 3]

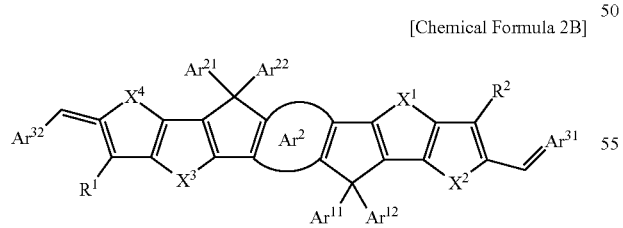

wherein, in Chemical Formula 3,
$X^a$ and $X^b$ are each independently S, Se, or Te,
$R^a$ and $R^b$ are each independently hydrogen or a C20 alkyl group, and
a and b are each independently 1 or 2,

[Chemical Formula 2B]

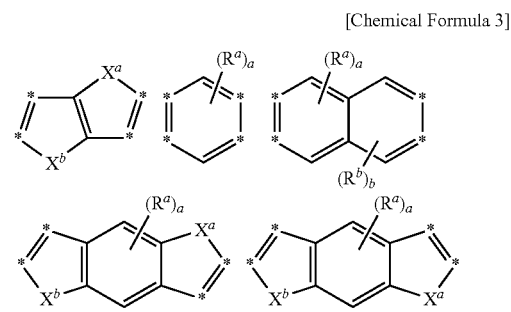

wherein, in Chemical Formula 2B,
$Ar^2$ is one of the moieties represented by Chemical Formula 3,
$X^1$, $X^2$, $X^3$, and $X^4$ are each independently S, Se, or Te,
$Ar^{11}$, $Ar^{12}$, $Ar^{21}$, and $Ar^{22}$ are each independently a substituted or unsubstituted C6 to C10 aryl group or a substituted or unsubstituted C3 to C10 heteroaryl group, $Ar^{31}$ and $Ar^{32}$ are each independently a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and
$R^1$ and $R^2$ are each independently hydrogen or a C1 to C10 alkyl group,

[Chemical Formula 2C]

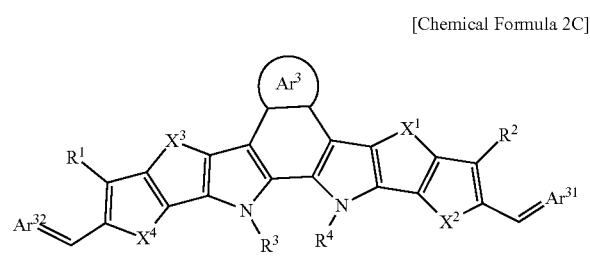

wherein, in Chemical Formula 2C,
$Ar^3$ is one of the moieties represented by Chemical Formula 4,
$X^1$, $X^2$, $X^3$, and $X^4$ are each independently S, Se, or Te,
$R^3$ and $R^4$ are each independently hydrogen, a C1 to C20 alkyl group, a C6 to C10 aryl group, or a C2 to C10 heteroaryl group,
$Ar^{31}$ and $Ar^{32}$ are each independently a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and
$R^1$ and $R^2$ are each independently hydrogen or a C1 to C10 alkyl group,

[Chemical Formula 4]

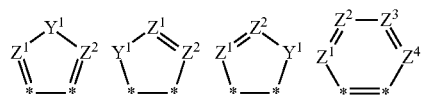

wherein, in Chemical Formula 4,
$Y^1$ is $CR^pR^q$, $NR^r$, O, S, Se, or Te, wherein $R^p$, $R^q$, and $R^r$ are each independently hydrogen or a C1 to C20 alkyl group, and
$Z^1$ to $Z^4$ are each independently $CR^s$ or N, wherein $R^s$ is hydrogen or a C1 to C20 alkyl group.

2. The infrared absorption composition of claim 1, wherein the p-type semiconductor compound represented by Chemical Formula 1 is one of compounds represented by Chemical Formulas 1A to 1C:

[Chemical Formula 1A]

[Chemical Formula 1B]

[Chemical Formula 1C]

wherein, in Chemical Formulas 1A to 1C,
$R^{1a}$, $R^{1b}$, $R^{1c}$, $R^{1d}$, $R^{2a}$, $R^{2b}$, $R^{2c}$, $R^{2d}$, $R^{3a}$, $R^{3b}$, $R^{3c}$, $R^{3d}$, $R^{4a}$, $R^{4b}$, $R^{4c}$, $R^{4d}$, b, n1, n2, n3, and n4 are the same as in Chemical Formula 1,
wherein, in Chemical Formula 1C,
$R^{5a}$ and $R^{5b}$ are hydrogen, a C1 to C6 alkyl group, or a C1 to C6 alkoxy group.

3. The infrared absorption composition of claim 1, wherein in Chemical Formula 1, X is Cl.

4. The infrared absorption composition of claim 1, wherein in Chemical Formula 1, two $R^{1a}$'s, two $R^{2a}$'s, two $R^{3a}$'s, and two $R^{4a}$'s are a C1 to C20 alkyl group or a C1 to C20 alkoxy group.

5. The infrared absorption composition of claim 1, wherein in Chemical Formulas 2A and 2B, $Ar^{11}$, $Ar^{12}$, $Ar^{21}$, and $Ar^{22}$ are each independently:
  a C6 to C10 aryl group substituted with a C1 to C20 alkyl group or a C1 to C20 alkoxy group, or
  a C3 to C10 heteroaryl group substituted with a C1 to C20 alkyl group or a C1 to C20 alkoxy group.

6. The infrared absorption composition of claim 1, wherein in Chemical Formulas 2A, 2B, and 2C, $Ar^{31}$ and $Ar^{32}$ are a cyclic group represented by one of Chemical Formulas 5A to 5F:

[Chemical Formula 5A]

wherein, in Chemical Formula 5A,
$Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group,
$Z^3$ is N or $CR^c$, wherein $R^c$ is hydrogen, deuterium, or a substituted or unsubstituted C1 to C10 alkyl group, $R^{11}$, $R^{12}$, $R^{13}$, $R^{14}$, and $R^{15}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), a cyano-containing group, or a combination thereof, wherein $R^{12}$, $R^{13}$, $R^{14}$, and $R^{15}$ are each independently present or $R^{12}$ and $R^{13}$ and $R^{14}$ and $R^{15}$ are linked to each other to provide a fused aromatic ring, n is 0 or 1, and

* is a linking position,

[Chemical Formula 5B]

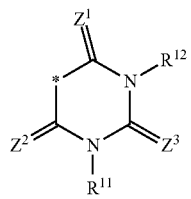

wherein, in Chemical Formula 5B, $Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group, $Z^3$ is O, S, Se, Te, or $C(R^a)(CN)$, wherein $R^a$ is hydrogen, a cyano group (—CN), or a C1 to C10 alkyl group, $R^{11}$ and $R^{12}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or a combination thereof, and

* is a linking position,

[Chemical Formula 5C]

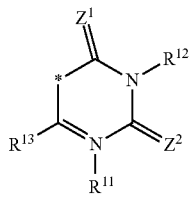

wherein, in Chemical Formula 5C, $Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group, $R^{11}$, $R^{12}$, and $R^{13}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or a combination thereof,

* is a linking position,

[Chemical Formula 5D]

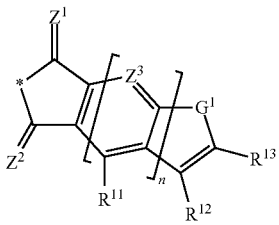

wherein, in Chemical Formula 5D, $Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group, $Z^3$ is N or $CR^c$, wherein $R^c$ is hydrogen or a substituted or unsubstituted C1 to C10 alkyl group, $G^1$ is O, S, Se, Te, $SiR^xR^y$, or $GeR^zR^w$, wherein $R^x$, $R^y$, $R^z$, and $R^w$ are each independently hydrogen, deuterium, a halogen, a substituted or unsubstituted C1 to C20 alkyl group, or a substituted or unsubstituted C6 to C20 aryl group, $R^{11}$, $R^{12}$, and $R^{13}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or a combination thereof, wherein $R^{12}$ and $R^{13}$ are each independently present or linked to each other to provide a fused aromatic ring, n is 0 or 1,

* is a linking position,

[Chemical Formula 5E]

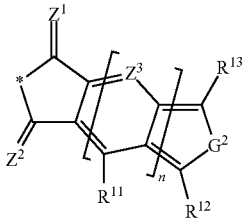

wherein, in Chemical Formula 5E, $Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group, $Z^3$ is N or $CR^c$, wherein $R^c$ is hydrogen or a substituted or unsubstituted C1 to C10 alkyl group, $G^2$ is O, S, Se, Te, $SiR^xR^y$, or $GeR^zR^w$, wherein $R^x$, $R^y$, $R^z$, and $R^w$ are each independently hydrogen, deuterium, a halogen, a substituted or unsubstituted C1 to C20 alkyl group, or a substituted or unsubstituted C6 to C20 aryl group, $R^{11}$, $R^{12}$, and $R^{13}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or a combination thereof, n is 0 or 1, and
* is a linking position,

[Chemical Formula 5F]

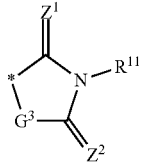

wherein, in Chemical Formula 5F,
$Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group,
$R^{11}$ is hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group (—CN), a cyano-containing group, or a combination thereof, and
$G^3$ is O, S, Se, Te, $SiR^xR^y$, or $GeR^zR^w$, wherein $R^x$, $R^y$, $R^z$, and $R^w$ are each independently hydrogen, deuterium, a halogen, a substituted or unsubstituted C1 to C20 alkyl group, or a substituted or unsubstituted C6 to C20 aryl group.

7. The infrared absorption composition of claim 1, wherein
the compound represented by Chemical Formula 2A is a compound represented by Chemical Formula 2A-1, and
the compound represented by Chemical Formula 2B is a compound represented by Chemical Formula 2B-1:

[Chemical Formula 2A-1]

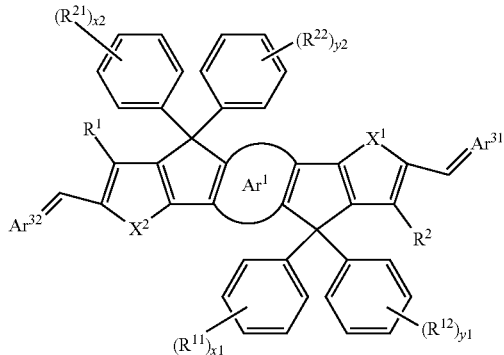

wherein, in Chemical Formula 2A-1,
$Ar^1$ is one of the moieties represented by Chemical Formula 3,
$X^1$ and $X^2$ are each independently S, Se, or Te,
$R^1$ and $R^2$ are each independently hydrogen or a C1 to C10 alkyl group,
$R^{11}$, $R^{12}$, $R^{21}$, and $R^{22}$ are each independently hydrogen, deuterium, a halogen, a substituted or unsubstituted C1 to C20 alkyl group, or a substituted or unsubstituted C6 to C20 aryl group, x1, y1, x2, and y2 are each independently an integer from 0 to 5, and
$Ar^{31}$ and $Ar^{32}$ are each independently a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof,

[Chemical Formula 2B-1]

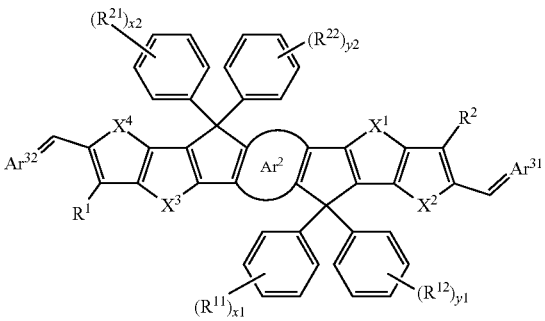

wherein, in Chemical Formula 2B-1,
$Ar^2$ is one of the moieties represented by Chemical Formula 3,
$X^1$, $X^2$, $X^3$, and $X^4$ are each independently S, Se, or Te,
$R^1$ and $R^2$ are each independently hydrogen or a C1 to C10 alkyl group,
$R^{11}$, $R^{12}$, $R^{21}$, and $R^{22}$ are each independently hydrogen, deuterium, a halogen, a substituted or unsubstituted C1 to C20 alkyl group, or a substituted or unsubstituted C6 to C20 aryl group, x1, y1, x2, and y2 are each independently an integer from 0 to 5, and
$Ar^{31}$ and $Ar^{32}$ are each independently a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof.

8. The infrared absorption composition of claim 1, wherein the fullerene derivative comprises a C60 to C120 fullerene substituted with a first functional group of an aryl group or a heterocyclic group and a second functional group of an alkyl ester group.

9. The infrared absorption composition of claim 1, wherein the fullerene derivative comprises [6,6]-phenyl-C61-butyric acid methyl ester (PC60BM), bis(1-[3-(methoxycarbonyl)propyl]-1-phenyl)-[6,6]C62 (bis-PCBM), phenyl-C70-butyric acid methyl ester (PC70BM), indene-C60 bisadduct (ICBA), or indene-C60 monoadduct (ICMA).

10. The infrared absorption composition of claim 1, wherein the p-type semiconductor compound and the n-type semiconductor compound are included in a volume ratio (p:n) of about 1:0.1 to about 1:10.

11. The infrared absorption composition of claim 1, wherein the infrared absorption composition has a peak absorption wavelength in a wavelength region of about 800 nm to about 3000 nm.

12. The infrared absorption composition of claim 1, wherein
n is 0 or 1 in Chemical Formula 1, or
n1 to n4 are 1 in Chemical Formula 1.

13. The infrared absorption composition of claim 1, wherein $X^1$, $X^2$, $X^3$, and $X^4$ are S in Chemical Formulas 2A, 2B, and 2C.

14. A photoelectric device, comprising:
a first electrode and a second electrode facing each other, and
a photoactive layer between the first electrode and the second electrode, wherein
the photoactive layer includes a p-type semiconductor compound represented by Chemical Formula 1 and an n-type semiconductor compound,
the n-type semiconductor compound includes a compound represented by Chemical Formula 2A, a compound represented by Chemical Formula 2B, a compound represented by Chemical Formula 2C, a fullerene derivative, or a combination thereof,
wherein the p-type semiconductor compound and the n-type semiconductor compound provide a bulk heterojunction (BHJ) structure,

[Chemical Formula 1]

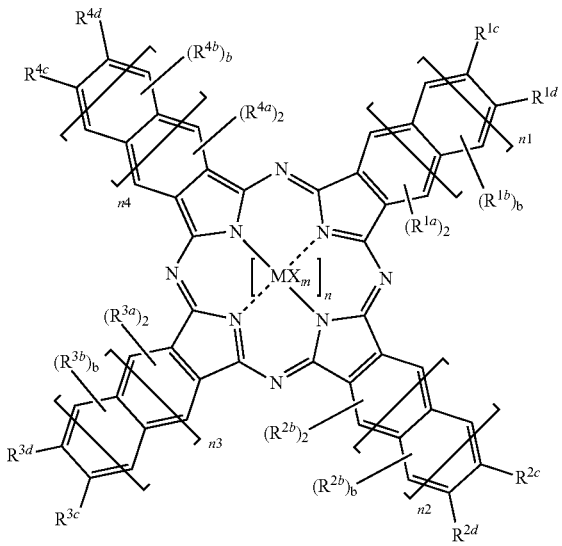

wherein, in Chemical Formula 1,
M is Sn, Ni, V, Al, Zn, Si, Co, or Ge,
X is a halogen,
m is an integer from 0 to 4,
n is 0 or 1,
two $R^{1a}$'s, two $R^{2a}$'s, two $R^{3a}$'s, and two $R^{4a}$'s are each the same as or different from each other and are each independently hydrogen, deuterium, a halogen, a cyano group (—CN), a C1 to C20 haloalkyl group, a C1 to C20 cyanoalkyl group, a C1 to C20 alkyl group, or a C1 to C20 alkoxy group, provided that at least one of two $R^{1a}$'s, at least one of two $R^{2a}$'s, at least one of two $R^{3a}$'s, and at least one of two $R^{4a}$'s are a C1 to C20 alkyl group or a C1 to C20 alkoxy group,
$R^{1b}$, $R^{1c}$, $R^{1d}$, $R^{2b}$, $R^{2c}$, $R^{2d}$, $R^{3b}$, $R^{3c}$, $R^{3d}$, $R^{4b}$, $R^{4c}$ and $R^{4d}$ are each independently hydrogen, deuterium, a halogen, a C1 to C20 haloalkyl group, a cyano group (—CN), a C1 to C20 cyanoalkyl group, a C1 to C20 alkyl group, or a C1 to C20 alkoxy group,
b is an integer of 0 to 2, and
n1, n2, n3, and n4 are each independently an integer from 1 to 4,

[Chemical Formula 2A]

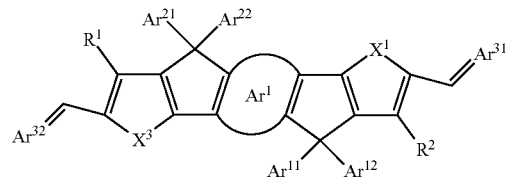

wherein, in Chemical Formula 2A,
$Ar^1$ is one of the moieties represented by Chemical Formula 3,
$X^1$ and $X^2$ are each independently S, Se, or Te,
$Ar^{11}$, $Ar^{12}$, $Ar^{21}$, and $Ar^{22}$ are each independently a substituted or unsubstituted C6 to C10 aryl group or a substituted or unsubstituted C3 to C10 heteroaryl group,
$Ar^{31}$ and $Ar^{32}$ are each independently a substituted or unsubstituted C6 to C30 hydrocarbon cyclic group having at least one functional group selected from C═O, C═S, C═Se, C═Te, and C═(CN)$_2$, a substituted or unsubstituted C2 to C30 heterocyclic group having at least one functional group selected from C═O, C═S, C═Se, C═Te, and C═(CN)$_2$, or a fused ring thereof, and
$R^1$ and $R^2$ are each independently hydrogen or a C1 to C10 alkyl group,

[Chemical Formula 3]

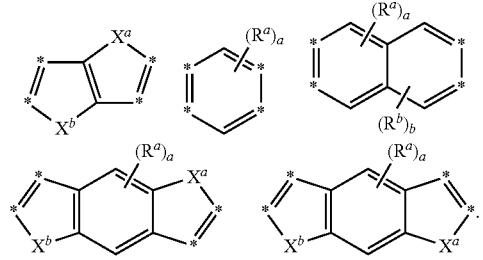

wherein, in Chemical Formula 3,
$X^a$ and $X^b$ are each independently S, Se, or Te,
$R^a$ and $R^b$ are each independently hydrogen or a C1 to C20 alkyl group, and
a and b are each independently 1 or 2,

[Chemical Formula 2B]

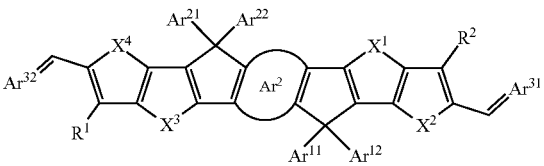

wherein, in Chemical Formula 2B,
$Ar^2$ is one of the moieties represented by Chemical Formula 3,
$X^1$, $X^2$, $X^3$, and $X^4$ are each independently S, Se, or Te,
$Ar^{11}$, $Ar^{12}$, $Ar^{21}$, and $Ar^{22}$ are each independently a substituted or unsubstituted C6 to C10 aryl group or a substituted or unsubstituted C3 to C10 heteroaryl group, Ar³¹ and Ar³² are each independently a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, R¹ and R² are each independently hydrogen or a C1 to C10 alkyl group,

[Chemical Formula 2C]

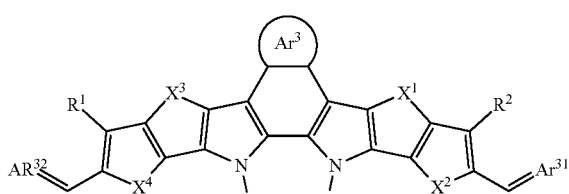

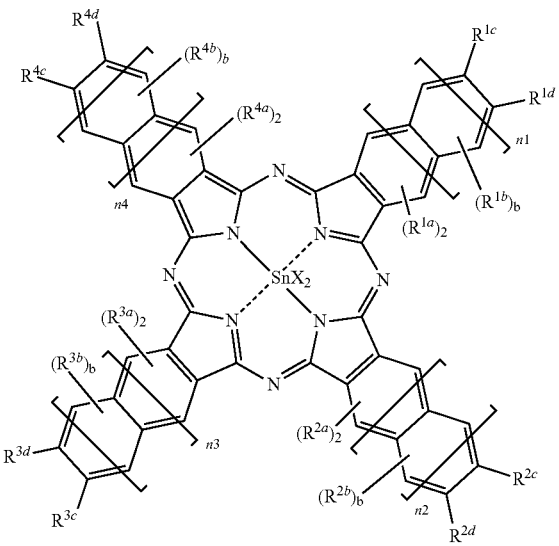

[Chemical Formula 1A]

wherein, in Chemical Formula 2C

Ar³ is one of the moieties represented by Chemical Formula 4,

X¹, X², X³, and X⁴ are each independently S, Se, or Te,

R³ and R⁴ are each independently hydrogen, a C1 to C20 alkyl group, a C6 to C10 aryl group, or a C2 to C10 heteroaryl group, Ar³¹ and Ar³² are each independently a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof, and R¹ and R² are each independently hydrogen or a C1 to C10 alkyl group:

[Chemical Formula 4]

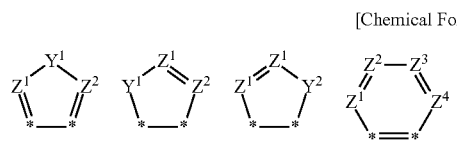

wherein, in Chemical Formula 4,

Y¹ is CR$^p$R$^q$, NR$^r$, O, S, Se, or Te, wherein R$^p$, R$^q$ and R$^r$ are each independently hydrogen or a C1 to C20 alkyl group, and Z¹ to Z⁴ are each independently CR$^s$ or N, wherein, R$^s$ is hydrogen or a C1 to C20 alkyl group.

15. The photoelectric device of claim 14, wherein the p-type semiconductor compound represented by Chemical Formula 1 is represented by one of compounds represented by Chemical Formulas 1A to 1C:

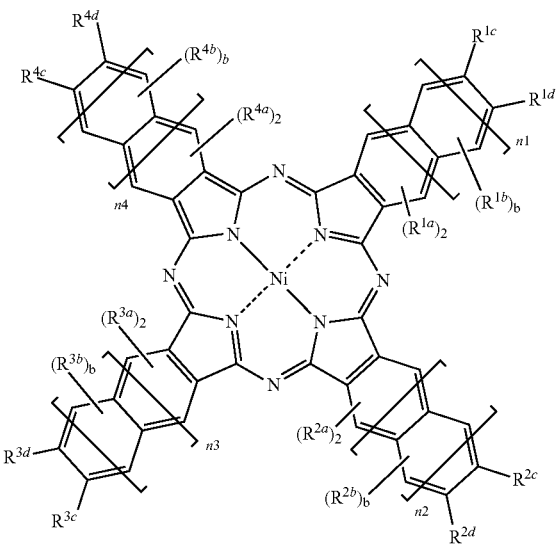

[Chemical Formula 1B]

-continued

[Chemical Formula 1C]

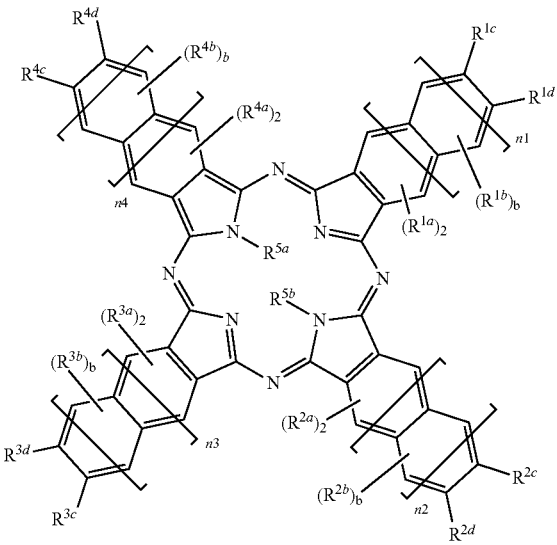

wherein, in Chemical Formulas 1A to 1C,
$R^{1a}, R^{1b}, R^{1c}, R^{1d}, R^{2a}, R^{2b}, R^{2c}, R^{2d}, R^{3a}, R^{3b}, R^{3c}, R^{3d}, R^{4a}, R^{4b}, R^{4c}, R^{4d}$, b, n1, n2, n3, and n4 are the same as in Chemical Formula 1, wherein, in Chemical Formula 1C,
$R^{5a}$ and $R^{5b}$ are hydrogen, a C1 to C6 alkyl group, or a C1 to C6 alkoxy group.

16. The photoelectric device of claim 14, wherein in Chemical Formula 1, X is Cl.

17. The photoelectric device of claim 14, wherein in Chemical Formula 1, two $R^{1a}$'s, two $R^{2a}$'s, two $R^{3a}$'s, and two $R^{4a}$'s are a C1 to C20 alkyl group or a C1 to C20 alkoxy group.

18. The photoelectric device of claim 14, wherein in Chemical Formulas 2A and 2B, $Ar^{11}$, $Ar^{12}$, $Ar^{21}$, and $Ar^{22}$ are each independently:
    a C6 to C10 aryl group substituted with a C1 to C20 alkyl group or a C1 to C20 alkoxy group, or
    a C3 to C10 heteroaryl group substituted with a C1 to C20 alkyl group or a C1 to C20 alkoxy group.

19. The photoelectric device of claim 14, wherein in Chemical Formulas 2A, 2B, and 2C, $Ar^{31}$ and $Ar^{32}$ are a cyclic group represented by one of Chemical Formulas 5A to 5F:

[Chemical Formula 5A]

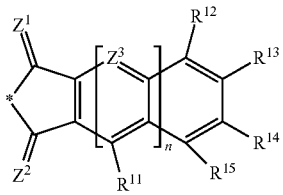

wherein, in Chemical Formula 5A,
$Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group,
$Z^3$ is N or $CR^c$, wherein $R^c$ is hydrogen, deuterium, or a substituted or unsubstituted C1 to C10 alkyl group, $R^{11}, R^{12}, R^{13}, R^{14}$, and $R^{15}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), a cyano-containing group, or a combination thereof, wherein $R^{12}, R^{13}, R^{14}$, and $R^{15}$ are each independently present or $R^{12}$ and $R^{13}$ and $R^{14}$ and $R^{15}$ are linked to each other to provide a fused aromatic ring, n is 0 or 1, and

* is a linking position,

[Chemical Formula 5B]

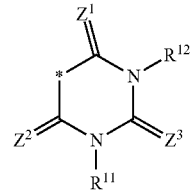

wherein, in Chemical Formula 5B,
$Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group, $Z^3$ is O, S, Se, Te, or $C(R^a)(CN)$, wherein $R^a$ is hydrogen, a cyano group, or a C1 to C10 alkyl group, $R^{11}$ and $R^{12}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, or a combination thereof, and

* is a linking position,

[Chemical Formula 5C]

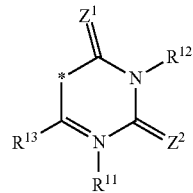

wherein, in Chemical Formula 5C,
$Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group, $R^{11}, R^{12}$, and $R^{13}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group (—CN), or a combination thereof, and

* is a linking position,

[Chemical Formula 5D]

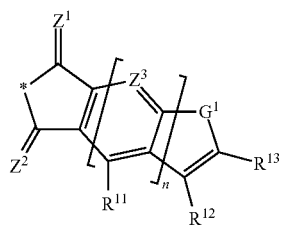

wherein, in Chemical Formula 5D,
$Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group,
$Z^3$ is N or $CR^c$, wherein $R^c$ is hydrogen or a substituted or unsubstituted C1 to C10 alkyl group,
$G^1$ is O, S, Se, Te, $SiR^xR^y$, or $GeR^zR^w$, wherein $R^x$, $R^y$, $R^z$, and $R^w$ are each independently hydrogen, deuterium, a halogen, a substituted or unsubstituted C1 to C20 alkyl group, or a substituted or unsubstituted C6 to C20 aryl group,
$R^{11}$, $R^{12}$, and $R^{13}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or a combination thereof, wherein $R^{12}$ and $R^{13}$ are each independently present or linked to each other to provide a fused aromatic ring,
n is 0 or 1, and
* is a linking position,

[Chemical Formula 5E]

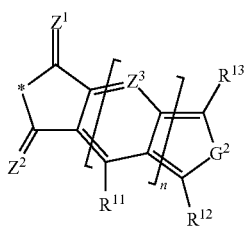

wherein, in Chemical Formula 5E,
$Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group,
$Z^3$ is N or $CR^c$, wherein $R^c$ is hydrogen or a substituted or unsubstituted C1 to C10 alkyl group,
$G^2$ is O, S, Se, Te, $SiR^xR^y$, or $GeR^zR^w$, wherein $R^x$, $R^y$, $R^z$, or $R^w$ are each independently hydrogen, deuterium, a halogen, a substituted or unsubstituted C1 to C20 alkyl group, or a substituted or unsubstituted C6 to C20 aryl group,
$R^{11}$, $R^{12}$, and $R^{13}$ are each independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or a combination thereof, n is 0 or 1, and
* is a linking position,

[Chemical Formula 5F]

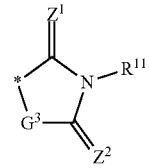

wherein, in Chemical Formula 5F,
$Z^1$ and $Z^2$ are each independently O, S, Se, Te, or $CR^aR^b$, wherein $R^a$ and $R^b$ are each independently hydrogen, a substituted or unsubstituted C1 to C10 alkyl group, or a cyano group,
$R^{11}$ is hydrogen, deuterium, a substituted or unsubstituted C1 to C30 alkyl group, a substituted or unsubstituted C6 to C30 aryl group, a substituted or unsubstituted C4 to C30 heteroaryl group, a halogen, a cyano group, a cyano-containing group, or a combination thereof, and
$G^3$ is O, S, Se, Te, $SiR^xR^y$, or $GeR^zR^w$, wherein $R^x$, $R^y$, $R^z$, and $R^w$ are each independently hydrogen, deuterium, a halogen, a substituted or unsubstituted C1 to C20 alkyl group, or a substituted or unsubstituted C6 to C20 aryl group.

20. The photoelectric device of claim 14, wherein
the compound represented by Chemical Formula 2A is a compound represented by Chemical Formula 2A-1, and
the compound represented by Chemical Formula 2B is a compound represented by Chemical Formula 2B-1:

[Chemical Formula 2A-1]

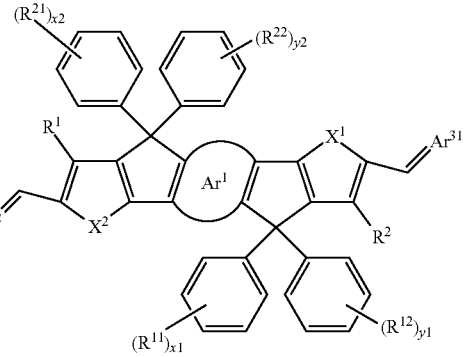

wherein, in Chemical Formula 2A-1,
$Ar^1$ is one of the moieties represented by Chemical Formula 3,
$X^1$ and $X^2$ are each independently S, Se, or Te,
$R^1$ and $R^2$ are each independently hydrogen or a C1 to C10 alkyl group,
$R^{11}$, $R^{12}$, $R^{21}$, and $R^{22}$ are each independently hydrogen, deuterium, a halogen, a substituted or unsubstituted C1 to C20 alkyl group, or a substituted or unsubstituted C6 to C20 aryl group, x1, y1, x2, and y2 are each independently an integer from 0 to 5, and
$Ar^{31}$ and $Ar^{32}$ are each independently a substituted or unsubstituted C6 to C30 hydrocarbon cyclic group having at least one functional group selected from C=O, C=S, C=Se, C=Te, and $C=(CN)_2$, a substituted or unsubstituted C2 to C30 heterocyclic group having at least one functional group selected from C=O, C=S, C=Se, C=Te, and C=(CN)$_2$, or a fused ring thereof,

[Chemical Formula 2B-1]

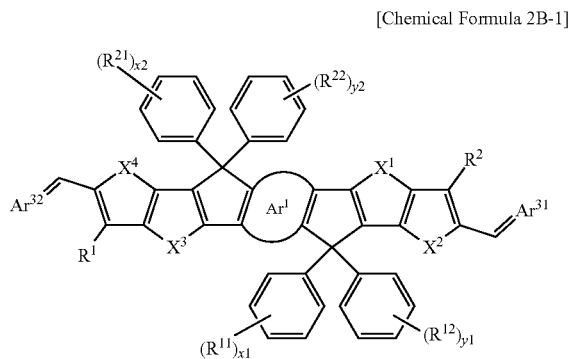

wherein, in Chemical Formula 2B-1,
Ar$^2$ is one of the moieties represented by Chemical Formula 3,
X$^1$, X$^2$, X$^3$, and X$^4$ are each independently S, Se, or Te,
R$^{11}$, R$^{12}$, R$^{21}$, and R$^{22}$ are each independently hydrogen, deuterium, a halogen, a substituted or unsubstituted C1 to C20 alkyl group, or a substituted or unsubstituted C6 to C20 aryl group, x1, y1, x2, and y2 are each independently an integer from 0 to 5, and
Ar$^{31}$ and Ar$^{32}$ are each independently a substituted or unsubstituted C6 to C30 hydrocarbon cyclic group having at least one functional group selected from C=O, C=S, C=Se, C=Te, and C=(CN)$_2$, a substituted or unsubstituted C2 to C30 heterocyclic group having at least one functional group selected from C=O, C=S, C=Se, C=Te, and C=(CN)$_2$, or a fused ring thereof.

21. The photoelectric device of claim 14, wherein the fullerene derivative comprises a C60 to C120 fullerene substituted with a first functional group of an aryl group or a heterocyclic group and a second functional group of an alkyl ester group.

22. The photoelectric device of claim 14, wherein the fullerene derivative comprises [6,6]-phenyl-C61-butyric acid methyl ester (PC60BM), bis(1-[3-(methoxycarbonyl)propyl]-1-phenyl)-[6,6]C62 (bis-PCBM), phenyl-C70-butyric acid methyl ester (PC70BM), indene-C60 bisadduct (ICBA), or indene-C60 monoadduct (ICMA).

23. The photoelectric device of claim 14, wherein the p-type semiconductor compound and the n-type semiconductor compound are included in a volume ratio (p:n) of about 1:0.1 to about 1:10.

24. The photoelectric device of claim 14, wherein an infrared absorption composition including the p-type semiconductor compound and the n-type semiconductor compound has a peak absorption wavelength in a wavelength region of about 800 nm to about 3000 nm.

25. An organic sensor comprising the photoelectric device of claim 14.

26. An electronic device comprising:
the organic sensor of claim 25.

27. An electronic device comprising:
the photoelectric device of claim 14.

* * * * *